(12) United States Patent
Ueda et al.

(10) Patent No.: US 6,326,311 B1
(45) Date of Patent: Dec. 4, 2001

(54) MICROSTRUCTURE PRODUCING METHOD CAPABLE OF CONTROLLING GROWTH POSITION OF MINUTE PARTICLE OR THIN AND SEMICONDUCTOR DEVICE EMPLOYING THE MICROSTRUCTURE

(75) Inventors: Tohru Ueda, Fukuyama; Yasumori Fukushima, Sakurai; Fumitoshi Yasuo, Ayama-gun, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/277,761

(22) Filed: Mar. 29, 1999

(30) Foreign Application Priority Data

Mar. 30, 1998 (JP) .................................................. 10-84094
Sep. 7, 1998 (JP) ................................................. 10-252367

(51) Int. Cl.$^7$ .................................................. H01L 29/72
(52) U.S. Cl. .............................. 438/694; 438/962; 257/9; 257/14; 257/17; 257/21; 257/23; 257/86; 257/88; 257/315
(58) Field of Search ................................ 257/315, 9, 14, 257/17, 23, 21, 86, 88; 438/962, 694

(56) References Cited

PUBLICATIONS

Yasuda et al., 45th Japan Society of Applied PhysicsAssociate Joint Lecture Meeting in 1998, lecture No. 28a–K–3, Proceeding p–751, Jan. 1998.*

Ishiguro, et al.; Japan Society of Applied Physics lectures in the spring of 1996, lecture No. 28a–PB–5, Proceeding p–798 and lecture No. 26P–ZA–12, Proceeding p–64—Mar. 1997.

Goto et al., Japan Society of Applied Physics lectures in the spring of 1997, lecture No. 28a–T–3, proceeding p–1313—Mar. 1997.

Sakurai et al., Japan Society of Applied Physics lectures in the spring of 1997, lecture No. 30a–PB–4, proceeding p–515—Mar. 1997.

Yasuda et al., the 45$^{th}$ Japan Society Applied Physcis Associate Joint lecture meeting in 1998, lecture No. 28a–K–3, Proceeding p–751—Jan. 1998.

* cited by examiner

Primary Examiner—Edward Wojciechowicz
(74) Attorney, Agent, or Firm—Nixon & Vanderhye, P.C.

(57) ABSTRACT

There is provided a microstructure producing method capable of achieving satisfactory uniformity and reproducibility of the growth position, size and density of a minute particle or thin line and materializing a semiconductor device which can reduce the cost through simple processes without using any special microfabrication technique and has superior characteristics appropriate for mass-production with high yield and high productivity as well as a semiconductor device employing the microstructure. An oxide film 12 having a region 12a of a great film thickness and a region 12b of a small film thickness are formed on the surface of a semiconductor substrate 11. Next, a microstructure that is a thin line 15 made of silicon Si is selectively formed only on the surface of the small-film-thickness region 12b of the oxide film 12.

33 Claims, 19 Drawing Sheets

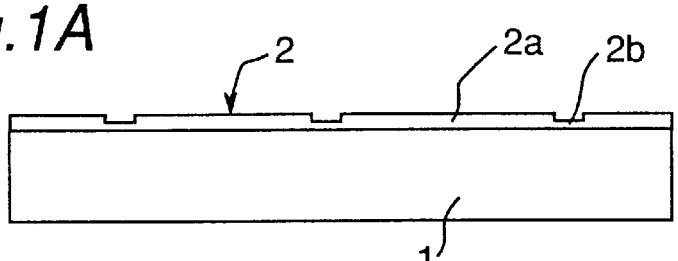
Fig.1A
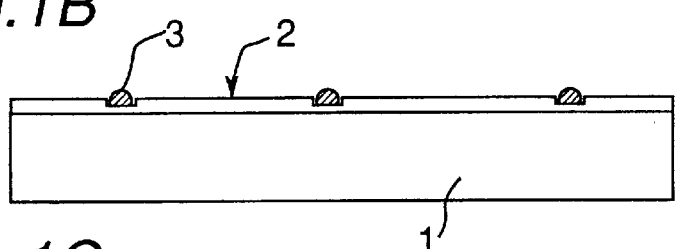
Fig.1B
Fig.1C
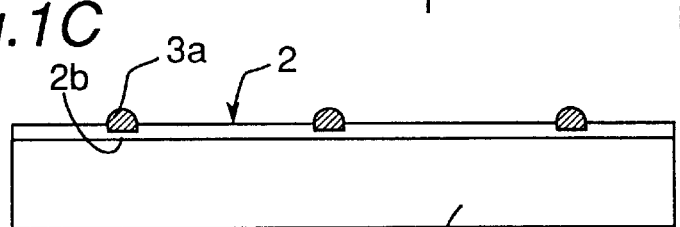
Fig.1D
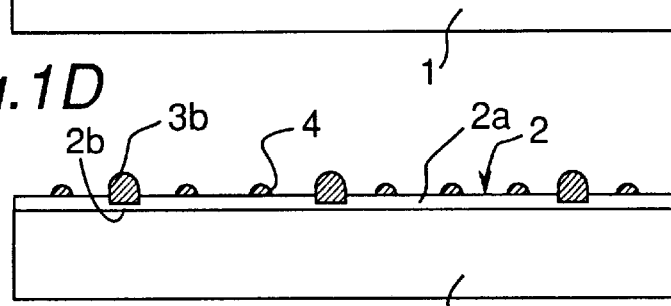
Fig.1E
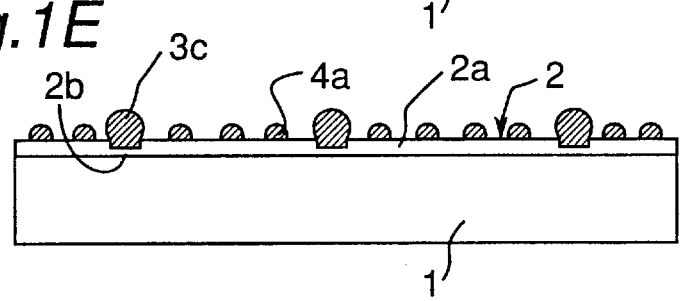
0 — Time of Growth
Growing Selectively in Region Having Small Film Thickness
Growing even in Region Having Great Film Thickness

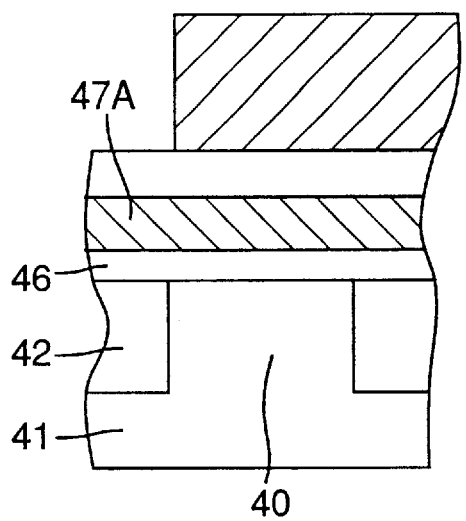 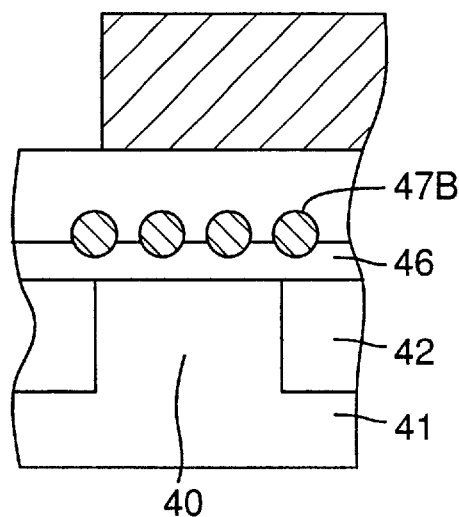
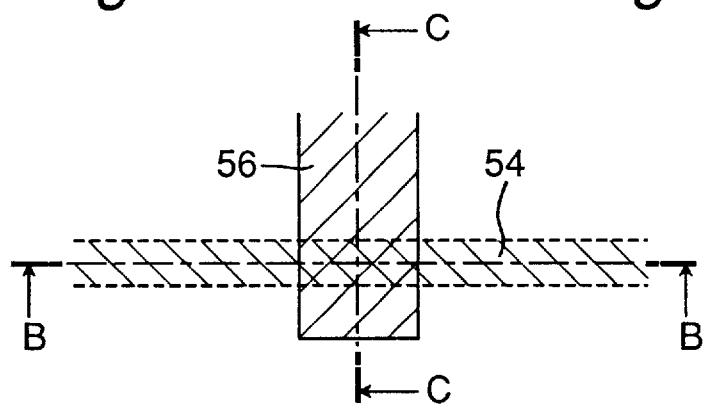 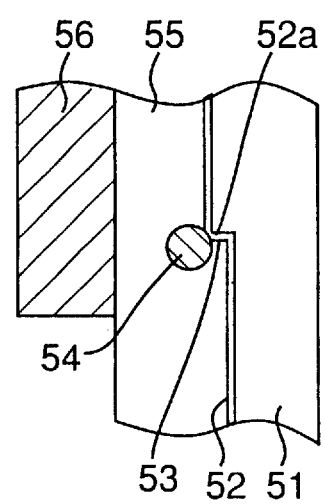
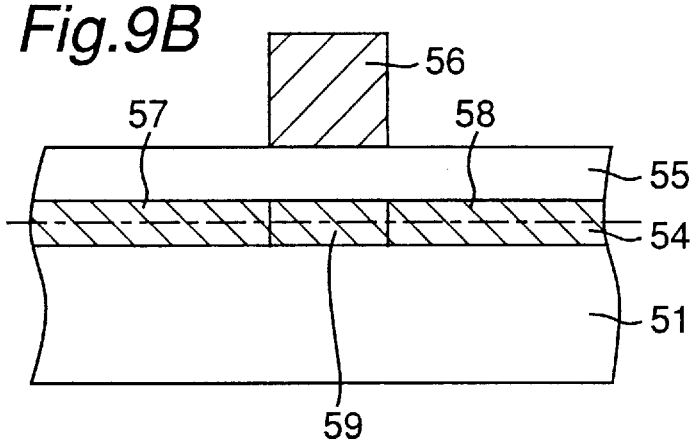

103 102 101

Si Growing only in Exposed Region of Si

Time of Growth

Si Growing even on Oxide Film

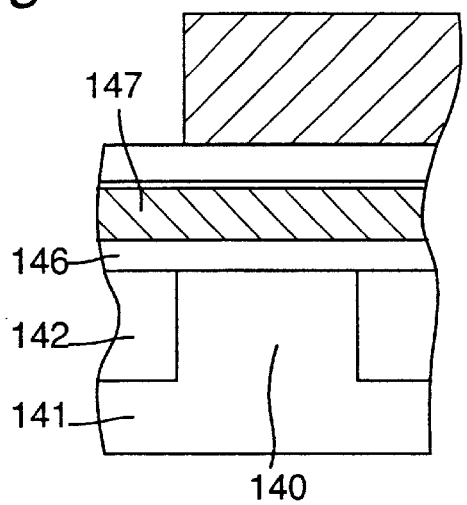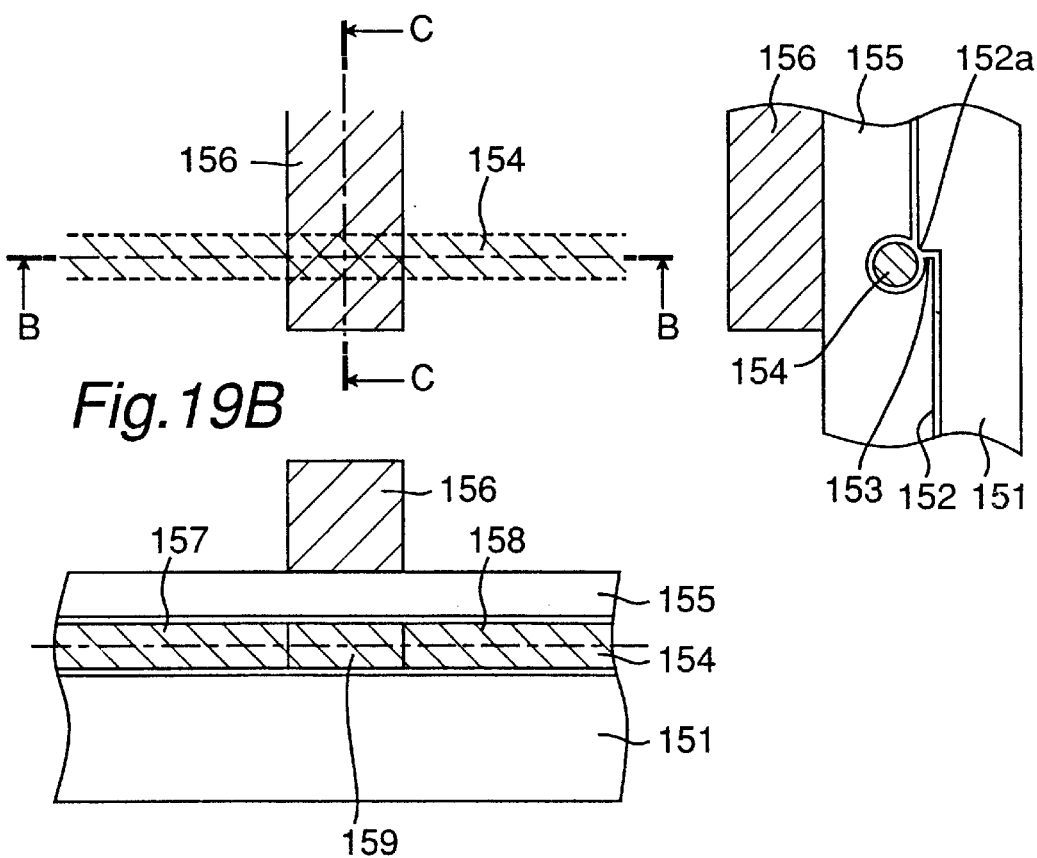

MICROSTRUCTURE PRODUCING METHOD CAPABLE OF CONTROLLING GROWTH POSITION OF MINUTE PARTICLE OR THIN AND SEMICONDUCTOR DEVICE EMPLOYING THE MICROSTRUCTURE

BACKGROUND OF THE INVENTION

The present invention relates to a microstructure producing method for forming a minute particle or thin line constructed of a metal or semiconductor, which is minute enough to produce a quantum size effect on an insulative substrate and to a semiconductor device employing a microstructure used as a single-electron device or a quantum-effect device.

Large-scale integrated circuits (LSIs), which have supported the progress of electronics that currently serves as a key industry, have remarkably improved the performances of large capacity, high speed and low power consumption by microstructural development. However, if the device size becomes equal to or smaller than 0.1 μm, then the device presumably encounters a limit on the conventional principle of operation, and this has stimulated energetic researches on a new device based on a new principle of operation. As this new device, there is a device having a microstructure called the quantum dot or quantum thin line of a nanometer size. The quantum dot of the nanometer size has been subjected to energetic researches for application to a single-electron device that employs, in particular, the coulomb blockade phenomenon, together with a variety of quantum-effect devices. The quantum thin line of the nanometer size is expected to be applied to a super-high-speed transistor utilizing the quantum effect.

As a new trend of future electronics, there is a grope for the fusion of an electronic circuit and an optical communication circuit. In such a case, it is indispensable to mount a photoelectric transducer on an LSI substrate, and accordingly, there is necessitated a light-receiving and light-emitting device employing an Si-based material that is the mainstream of LSIs. The light-receiving device has conventionally been put into practical use with the Si-based material. However, with regard to light emission, it has been the accepted view that light emission is not effected since the Si-based IV-group semiconductors have an indirect transition type bandgap. However, it has lately been confirmed that light emission is effected by a minute crystal grain having a size of not greater than 10 nm due to the existence of a direct transition type band structure, and this has stimulated energetic researches.

Aside from the aforementioned example, there have been conducted a variety of researches on the formation techniques of the quantum dot or quantum thin line, intended for application to a variety of electronic and optical devices utilizing the features of the quantum effect and so on. The formation techniques of the quantum dot or quantum thin line disclosed in the following reference documents of (1) through (5) will be described below.

(1) Reference document of Japanese Patent Laid-Open Publication No. HEI 8-64525

FIG. 20 is a sectional view showing the construction of the "Quantum dot producing method and single-electron transistor employing the quantum dot" disclosed in the above reference document of Japanese Patent Laid-Open Publication No. HEI 8-64525. The above single-electron transistor is fabricated by forming an insulating film 72 on a silicon substrate 71, thereafter depositing a conductive film on the insulating film 72 and patterning the conductive film for the formation of a source region 74 and a drain region 75. Next, Si minute particles are deposited to a size of 20 Å at intervals of 20 Å in a high vacuum environment at a temperature of 125° C. by the electron beam evaporation method and then thermally treated at a temperature of 500° C. In this stage, in order to stably grow the Si minute particles with good controllability, the deposition temperature of the silicon substrate 71 is lowered close to the lower limit temperature (about 240° C.) of the Si deposition, thereby depositing amorphous Si minute particles. Thereafter, the Si minute particles are crystallized by heat treatment at a temperature of not lower than the crystallizing temperature (240° C.), thereby forming crystalline Si minute particles 73. Next, a gate insulating film 76 is deposited to a thickness of 40 Å on the insulating film 72, crystalline Si minute particles 73, source region 74 and drain region 75, and a gate electrode 78 is formed on the region of the gate insulating film 76 corresponding to a region between the source region 74 and the drain region 75. This single-electron transistor is used by applying a voltage across the source region 74 and the drain region 75 for the formation of a current between the source region 74 and the drain region 75 via the crystalline Si minute particles 73 and controlling the current by a voltage applied to the gate electrode 78. When no voltage is applied to the gate electrode 78, no current flows due to the coulomb blockade phenomenon produced by the quantum size effect in the crystalline Si minute particles 73. However, if a tunnel resistance between the crystalline Si minute particles 73 is made not greater than the quantum resistance by applying a voltage to the gate electrode 78, then a current flows as a consequence of the breakdown of the coulomb blockade phenomenon.

FIG. 21 is a sectional view showing the construction of the "Light-emitting device employing quantum dot" disclosed in the reference document of Japanese Patent Laid-Open Publication No. HEI 8-64525. As shown in FIG. 21, the light-emitting device is fabricated by forming an insulating film 82 of a thin film (30 Å) on a silicon substrate 81, forming crystalline Si minute particles 83 on the insulating film 82 by a method similar to the single-electron transistor fabricating method, thereafter depositing an insulating film 84 of a thin film (30 Å) on the film and particles and further forming a transparent electrode 85 on the insulating film 84. This light-emitting device emits light by injecting a carrier into the crystalline Si minute particles 83 with a tunnel current formed by applying a voltage across the transparent electrode 85 that serves as an upper electrode and the silicon substrate 81 that serves as a lower electrode.

(2) Ishiguro, et al., Japan Society of Applied Physics lectures in the spring of 1996, lecture No. 28a-PB-5, Proceeding p-798 and lecture No. 26P-ZA-12, Proceeding p-64

FIGS. 22A through 22D are process charts showing the "Method for producing uniform Si quantum thin line on SIMOX substrate utilizing anisotropic etching" disclosed in the above reference document of the item (2).

First, as shown in FIG. 22A, silicon nitride ($Si_3N_4$) is deposited on a (100) SIMOX substrate constructed of a silicon substrate 91, an oxide film 92 and an SOI (Silicon On Insulator) film 93, and thereafter patterning is performed to form a silicon nitride film 94.

Next, as shown in FIG. 22B, anisotropic etching is performed using TMAH (Tetra Methyl Ammonium-Hydroxide) with the silicon nitride film 94 used as a mask, thereby forming an SOI film 93a having a (111) plane on the pattern edge.

Next, as shown in FIG. 22C, the (111) plane of the sidewall of the SOI film 93a is selectively oxidized with the silicon nitride film 94 used as a mask, thereby forming an oxide film 95.

Then, as shown in FIG. 22D, the silicon nitride film 94 is removed, and thereafter the anisotropic etching is performed again by TMAH with the oxide film 95 used as a mask, thereby forming an Si quantum thin line 96 having a width of 10 nm and a length of 100 nm. The width of the Si quantum thin line 96 depends on the film thickness of the SOI film 93.

In a quantum thin line MOSFET where the Si quantum thin line 96 is formed as a channel region similar to the single-electron device shown in FIG. 21, coulomb blockade vibration, or the feature of the single-electron phenomenon is observed at room temperature (see FIG. 23). FIG. 23 shows the gate dependency of the drain current of the single-electron device employing the Si quantum thin line, where the horizontal axis represents the gate voltage and the vertical axis represents the drain current.

(3) Goto, et al., Japan Society of Applied Physics lectures in the spring of 1997, lecture No. 28a-T-3, proceeding p-1313

According to the "Method for forming quantum dot of metal material" disclosed in the above reference document of the item (3), by the magnetron sputter clustering method for sputtering Al by DC (Direct Current) discharge (220 V, 0.4 A) of Ar gas ($4\times10^{-3}$ Torr) and clustering Al by He gas filled around there, a spherical aluminum cluster having a diameter of 5 to 500 nm is generated.

(4) Sakurai, et al., Japan Society of Applied Physics lectures in the spring of 1997, lecture No. 30a-PB4, proceeding p-515

According to the "Quantum thin line of metal material" disclosed in the above reference document of the item (4), Al is deposited to a width of 30 $\mu$m and a thickness of 8 nm on an $SiO_2$ insulating substrate, and thereafter, Al located in the region other than the region of the Al thin line is oxidized by means of AFM (Atomic Force Microscope). Specifically, Al is oxidized to become an insulating film by applying a voltage across an AFM probe and Al, and the remaining portion becomes the Al thin line having a width of 20 nm.

(5) Yasuda, et al., the 45th Japan Society of Applied Physics Associate Joint lecture meeting, lecture No. 28a-K-3, Proceeding p-751

According to the "Characteristics and applications of oxide film/nitride film as Si selective growth use mask" disclosed in the above reference document of the item (5), as shown in FIGS. 24A and 24B, an electron beam is applied to a very thin $SiO_2$ oxide film 202 (having a film thickness of 5 to 20 Å) formed on the surface of a silicon substrate 201 so as to desorb oxygen, thereby transubstantiating the applied portion 203 into Si-rich SiOx. Thereafter, Si is made to selectively grow only on the surface of the transubstantiated applied portion 203, thereby forming an Si thin line 204 (FIG. 24C). In this stage, the Si growth is performed by setting the substrate temperature to 580° C. and using disilane ($Si_2H_6$) gas as a material gas.

In order to mount the quantum dot or the quantum thin line which serves as the base of the aforementioned quantum-effect device or single-electron device on a substrate identical to that of an Si-based large-scale integrated circuit that has conventionally been the mainstream, the following problems exist.

According to the "Quantum dot producing method and single-electron transistor and light-emitting device employing the quantum dot" of the aforementioned item (1), the crystalline particles of the very small size generating in the initial deposition stage of electron beam deposition cannot be controlled with regard to their growth position, size and density and are strongly influenced by the surface conditions of surface roughness, impurities and so on. Therefore, it is very difficult to assure the uniformity and reproducibility, for which the method is hard to take effect as a mass-production technique.

The "Method for producing uniform Si quantum thin line on SIMOX substrate utilizing anisotropic etching" of the aforementioned item (2) necessitates a depositing process and a removing process for silicon nitride $Si_3N_4$ and an etching process for the Si layer. Therefore, the method, which disadvantageously results in high cost and degraded yields leading to low productivity, is hard to take effect as a realistic mass-production technique.

The "Method for forming quantum dot of metal material" of the aforementioned item (3) utilizes the clustering reaction by means of sputtering and vapor growth. Therefore, it is very difficult to assure the uniformity and reproducibility of the growth position, size and density of the crystalline particles, for which the method is hard to take effect as a mass-production technique.

The "Quantum thin line of metal material" of the aforementioned item (4) necessitates the very special microstructural technique such as AFM. However, there is currently no available apparatus capable of performing the formation in the desired positions throughout the entire surface of the substrate, and there is another problem about how to uniformly form the thin line width with satisfactory reproducibility. In developing a mass-production apparatus, there are many problems about how to manage alignment and how to secure a realistic throughput.

Furthermore, according to the "Characteristics and applications of oxide film/nitride film as Si selective growth use mask" disclosed in the reference document of the aforementioned item (5), the grown Si, which is polycrystal, has a crystallinity inferior to monocrystal, consequently failing in materializing a device having superior characteristics. Furthermore, due to the use of electron beam, there is currently a low productivity, for which the method is hard to take effect as a realistic mass-production technique. Furthermore, the width of the thin line is determined depending on the beam diameter of the electron beam, and it is impossible for the currently available beam diameter to achieve a dimension of not greater than 10 nm required for producing the quantum effect.

SUMMARY OF THE INVENTION

Accordingly, the object of the present invention is to provide a microstructure producing method capable of controlling the growth position of a minute particle or a thin line, achieving satisfactory uniformity and reproducibility of the size and density of the minute particle or the thin line and materializing a semiconductor device which can be produced at low cost with high yield and high productivity through simple processes without using any special microfabrication technique and has superior characteristics appropriate for mass-production as well as a semiconductor device employing the microstructure.

In order to achieve the above object, the present invention provides a microstructure producing method comprising the steps of:

forming an insulating thin film having a region of a great film thickness and a region of a small film thickness in at least one portion of a semiconductor substrate surface; and selectively forming a microstructure of at least one of a minute particle and a thin line, each of which is comprised of a metal or semiconductor, only in the region of the small film thickness of the insulating thin film.

The above microstructure producing method is capable of forming the insulating thin film having the region of the great film thickness and the region of the small film thickness in at least one portion of the semiconductor substrate surface and thereafter selectively forming the microstructure constructed of at least one of the minute particle and the thin line made of the metal or semiconductor only in the region of the small film thickness of the insulating thin film. Therefore, by controlling the position in which the region of the small film thickness of the insulating thin film is formed, by the generic film forming technique, lithography technique, etching technique and so on, the growth position of the minute particle or the thin line can be controlled, and the uniformity and reproducibility of the size and density of the minute particle or the thin line become satisfactory. The microstructure of the minute particle or the thin line of the size capable of producing the quantum effect can be formed through simple processes without using any specific microfabrication technique, and therefore, a microstructure producing method that is able to reduce the manufacturing cost and appropriate for mass-production ensuring high yield and high productivity can be achieved. By using the above microstructure, a semiconductor device having superior characteristics can be materialized.

In a microstructure producing method of an embodiment, the step of forming the insulating thin film on the semiconductor substrate surface includes forming an insulating thin film on the semiconductor substrate surface and thereafter reducing in thickness only a partial region of the insulating thin film.

According to the microstructure producing method of the above embodiment, the insulating thin film is once formed on the semiconductor substrate surface by the generic film forming technique, lithography technique, etching technique and so on, and thereafter only the partial region of the insulating thin film is reduced in thickness. Therefore, the thin region can be formed on the insulating thin film through simple processes.

In an embodiment, the step of forming the insulating thin film on the semiconductor substrate surface includes forming a first portion that becomes the thick region on the semiconductor substrate surface, removing only a partial region of the first portion and thereafter forming the second portion that becomes the thin region on the semiconductor substrate surface from which the first portion is removed.

According to the microstructure producing method of the above embodiment, the first portion is once formed on the semiconductor substrate surface, and the second portion is formed on the semiconductor substrate surface from which the first portion is removed, after partially exposing the semiconductor substrate surface by removing only the partial region of the first portion. Therefore, by controlling the position in which the exposed region of the semiconductor substrate surface is formed, by the generic film forming technique, lithography technique, etching technique and so on, the position in which the microstructure is formed can be easily controlled.

In an embodiment, the semiconductor substrate surface is partially exposed by patterning the first portion after the formation of the first portion on the semiconductor substrate surface, and thereafter the second portion is formed by oxidizing the exposed region of the semiconductor substrate surface.

According to the microstructure producing method of the above embodiment, the second portion is formed by oxidizing the exposed region of the semiconductor substrate surface. Therefore, the small-film-thickness region can be obtained through simple processes.

In an embodiment, the semiconductor substrate surface is partially exposed by patterning the first portion after the formation of the first portion on the semiconductor substrate surface, and thereafter the second portion is deposited on the exposed region of the semiconductor substrate surface.

According to the microstructure producing method of the above embodiment, the second portion is deposited on the exposed region of the semiconductor substrate surface. Therefore, the small-film-thickness region can be obtained through simple processes.

An embodiment further comprises the step of forming an edge portion on the semiconductor substrate surface prior to the step of forming the insulating thin film on the semiconductor substrate surface, and wherein the step of forming the insulating thin film on the semiconductor substrate surface includes forming the insulating thin film by oxidizing the semiconductor substrate surface on which the edge portion is formed so as to form the region of the small film thickness smaller than that of the other region in the edge portion of the insulating thin film.

According to the microstructure producing method of the above embodiment, by preliminary forming the edge portion (end, edge, stepped portion corner, sharp portion, blade edge or the like) on the semiconductor substrate surface and oxidizing the semiconductor substrate surface, the oxide film thinner than the other portion is formed in the edge portion. This is because the release of stress does not progress in the edge portion during oxidation and the oxide film thickness becomes smaller than the other portion. This tendency becomes more significant as the oxidation temperature is lowered. Therefore, by oxidizing the semiconductor substrate whose surface shape has been preliminary processed, the small-film-thickness region can be easily formed on the oxide film that serves as the insulating thin film.

An embodiment further comprises the step of forming a shape having a difference in level or a sharp edge on the semiconductor substrate surface prior to the step of forming the insulating thin film on the semiconductor substrate surface, and wherein the step of forming the insulating thin film on the semiconductor substrate surface includes forming the insulating thin film by oxidizing the semiconductor substrate surface on which the shape having the difference in level or the sharp edge is formed, so as to form the region of the small film thickness smaller than that of the other region in the shape having the difference in level or the sharp edge of the insulating thin film.

According to the microstructure producing method of the above embodiment, by preliminary forming the shape having the difference in level or the sharp edge on the semiconductor substrate surface and oxidizing the semiconductor substrate surface, the oxide film thinner than the other portion is formed on the shape having the difference in level or the sharp edge. This is because the release of stress does not progress in the shape having the difference in level or the sharp edge during oxidation and its oxide film thickness becomes smaller than the other portion. This tendency becomes more significant as the oxidation temperature is lowered. Therefore, by oxidizing the semiconductor substrate whose surface shape has been preliminary processed, the small-film-thickness region can be easily formed on the oxide film that serves as the insulating thin film.

In an embodiment, the step of forming the microstructure only on the surface of the region having the small film thickness of the insulating thin film includes introducing the semiconductor substrate into a reaction chamber, evacuating the reaction chamber so as to produce a high vacuum of not greater than $10^{-6}$ Torr inside the reaction chamber, thereafter making a material gas flow inside the reaction chamber and subjecting the microstructure to vapor growth only in the region having the small film thickness of the insulating thin film under a material gas partial pressure of not greater than $10^{-2}$ Torr.

According to the microstructure producing method of the above embodiment, the semiconductor substrate is introduced into the reaction chamber, and thereafter the atmospheric components and impurities such as moisture inside the reaction chamber are discharged so as to produce a high vacuum of not greater than $10^{-6}$ Torr inside the reaction chamber, thereby stimulating epitaxial growth in the environment of high purity. Subsequently, by making the material gas flow for the achievement of a material gas partial pressure of not greater than $10^{-2}$ Torr, the microstructure, which is either one of the minute particle or the thin line, is subjected to vapor growth only in the small-film-thickness region of the insulating thin film that serves as the base. If the material gas partial pressure exceeds $10^{-2}$ Torr in this reaction stage, then film growth immediately starts throughout the entire surface of the insulating thin film, so that the selective growth cannot be achieved. As described above, by controlling the degree of vacuum, the amount of introduction and the time of introduction of the material gas, the substrate temperature and so on inside the reaction chamber by means of the generic high-vacuum CVD reactor, the minute particle or the thin line of the desired size and density can be uniformly formed with high reproducibility.

In an embodiment, the microstructure is made of silicon; and any one of monosilane ($SiH_4$), disilane ($Si_2H_6$), trisilane ($Si_3H_8$), dichlorosilane ($SiH_2Cl_2$) and tetrachlorosilane ($SiCl_4$) is used as the material gas.

According to the microstructure producing method of the above embodiment, by using any one of monosilane ($SiH_4$), disilane ($Si_2H_6$), trisilane ($Si_3H_8$), dichlorosilane ($SiH_2Cl_2$) and tetrachlorosilane ($SiCl_4$) as the material gas and inducing a reaction by means of the generic CVD reactor for the formation of the aforementioned minute particle or thin line made of silicon on the small-film-thickness region of the insulating thin film, the uniformity and reproducibility of the size and density of the minute particle or the thin line are further improved.

In an embodiment, the microstructure is made of germanium; and any one of monogermane ($GeH_4$), digermane ($Ge_2H_6$) and germanium tetrafluoride ($GeF_4$) is used as the material gas.

According to the microstructure producing method of the above embodiment, by using any one of monogermane ($GeH_4$), digermane ($Ge_2H_6$) and germanium tetrafluoride ($GeF_4$) as the material gas and inducing a reaction by means of the generic CVD reactor for the formation of the aforementioned minute particle or thin line made of germanium on the small-film-thickness region of the insulating thin film, the uniformity and reproducibility of the size and density of the minute particle or the thin line are further improved.

In an embodiment, the microstructure is made of silicon germanium; and a mixed gas of a gas of any one of monosilane ($SiH_4$), disilane ($Si_2H_6$), trisilane ($Si_3H_8$), dichlorosilane ($SiH_2Cl_2$) and tetrachlorosilane ($Si_3H_8$) and a gas of any one of monogermane ($GeH_4$), digermane ($Ge_2H_6$) and germanium tetrafluoride ($GeF_4$) is used as the material gas.

According to the microstructure producing method of the above embodiment, by using the mixed gas of the gas of any one of monosilane ($SiH_4$), disilane ($Si_2H_6$), trisilane ($Si_3H_8$), dichlorosilane ($SiH_2Cl_2$) and tetrachlorosilane ($SiCl_4$) and the gas of any one of monogermane ($GeH_4$), digermane ($Ge_2H_6$) and germanium tetrafluoride ($GeF_4$) as the material gas and inducing a reaction by means of the generic CVD reactor for the formation of the aforementioned minute particle or thin line made of silicon germanium on the small-film-thickness region of the insulating thin film, the uniformity and reproducibility of the size and density of the minute particle or the thin line are further improved.

In an embodiment, the microstructure is made of aluminum; and an organic aluminum is used as a material.

According to the microstructure producing method of the above embodiment, by using the organic aluminum such as dimethylaluminum hydride (DMAH: $(CH_3)_2AlH$) as the material because the minute particle or the thin line is made of aluminum and inducing a reaction by means of, for example, the organic metal CVD reactor for the formation of the aforementioned minute particle or thin line made of aluminum on the small-film-thickness region of the insulating thin film, the uniformity and reproducibility of the size and density of the minute particle or the thin line are further improved.

The present invention also provides a microstructure producing method comprising the steps of:

forming an edge portion on a semiconductor substrate surface;

forming an insulating thin film in a region other than the edge portion of the semiconductor substrate surface; and selectively forming a microstructure that is a thin line made of a semiconductor only on a surface of the edge portion.

According to the microstructure producing method of the present invention, by forming the insulating thin film in the region other than the edge portion by, for example, oxidation and etching on the semiconductor substrate surface on which the edge portion (end, edge, stepped portion corner, blade edge or the like) is formed, the fine line-shaped region where the semiconductor substrate is exposed along the edge portion is formed. Subsequently, the microstructure that is the thin line made of the semiconductor is selectively formed by means of the CVD reactor or the like only on the surface of the edge portion where the semiconductor substrate is exposed. Therefore, by controlling the position in which the edge portion that is not covered with the insulating thin film is formed by the generic film forming technique, lithography technique, etching technique and so on, the growth position of the thin line can be controlled and the uniformity and reproducibility of the size of the thin line become satisfactory. The microstructure that is the semiconductor thin line having a width of not greater than 10 nm capable of producing the quantum effect can be formed through simple processes without using any specific microfabrication technique, and therefore, a microstructure producing method that is able to reduce the manufacturing cost and appropriate for mass-production ensuring high yield and high productivity can be achieved. By using the above microstructure as a quantum thin line, a semiconductor device having superior characteristics can be materialized.

In an embodiment, the step of forming the insulating thin film in the region other than the edge portion includes forming the insulating thin film by oxidizing the semiconductor substrate on which the edge portion is formed, forming a region of a film thickness smaller than that of the other region in the edge portion of the insulating thin film and thereafter exposing only the semiconductor surface of the edge portion by further etching the insulating thin film.

According to the microstructure producing method of the above embodiment, by preliminarily forming the edge portion (end, edge, stepped portion corner, blade edge or the like) on the semiconductor substrate surface and oxidizing the semiconductor substrate surface, the oxide film thinner than the other portion is formed as the insulating thin film on the edge portion. This is because the release of stress does not progress in the edge portion during oxidation and the film thickness of the insulating thin film becomes smaller than the other portion. This tendency becomes more significant as the oxidation temperature is lowered. By removing only the region of the film thickness smaller than that of the other region from the edge portion of the insulating thin film, only the semiconductor surface at the edge portion can be easily exposed.

An embodiment further comprises the step of transubstantiating a connecting region of the microstructure that is the thin line made of the semiconductor and the semiconductor substrate into an oxide film through oxidation after forming the microstructure that is the thin line made of the semiconductor.

According to the microstructure producing method of the above embodiment, by transubstantiating the connecting region of the microstructure that is the thin line made of the semiconductor and the semiconductor substrate into the oxide film through oxidation after the formation of the microstructure that is the thin line made of the semiconductor, the thin line and the semiconductor substrate can be isolated from each other by the oxide film. Therefore, a quantum thin line that can be applied to a single-electron device can be obtained.

In an embodiment, the step of transubstantiating the connecting region of the microstructure that is the thin line made of the semiconductor and the semiconductor substrate into the oxide film through oxidation includes once removing the insulating thin film and thereafter transubstantiating the connecting region of the microstructure that is the thin line made of the semiconductor and the semiconductor substrate into the oxide film through oxidation.

According to the microstructure producing method of the above embodiment, the insulating thin film is removed once prior to transubstantiating the connecting region of the microstructure that is the thin line made of the semiconductor and the semiconductor substrate into the oxide film through oxidation. Subsequently, the connecting region of the microstructure that is the thin line made of the semiconductor and the semiconductor substrate is transubstantiated into the oxide film by being directly oxidized. By so doing, the oxide film that can reliably isolate the thin line from the semiconductor substrate can be formed.

In an embodiment, the step of selectively forming the microstructure that is the thin line made of the semiconductor only on the surface of the edge portion includes introducing the semiconductor substrate into a reaction chamber, evacuating the reaction chamber so as to produce a high vacuum of not greater than $10^{-6}$ Torr inside the reaction chamber, thereafter making a material gas flow inside the reaction chamber and subjecting the microstructure of the thin line made of the semiconductor to vapor growth only on the surface of the edge portion under a material gas partial pressure of not greater than $10^{-2}$ Torr.

According to the microstructure producing method of the above embodiment, the semiconductor substrate is introduced into the reaction chamber, and thereafter the atmospheric components and impurities such as moisture inside the reaction chamber are discharged so as to produce a high vacuum of not greater than $10^{-6}$ Torr inside the reaction chamber, thereby stimulating epitaxial growth in the environment of high purity. Subsequently, by making the material gas flow for the achievement of a material gas partial pressure of not greater than $10^{-2}$ Torr, the microstructure that is the thin line is subjected to vapor growth only on the surface (in the exposed region of the semiconductor substrate) of the edge portion that serves as the base. If the material gas partial pressure exceeds $10^{-2}$ Torr in this reaction stage, then film growth immediately starts throughout the entire surface of the insulating thin film, so that the selective growth cannot be achieved. Therefore, by controlling the degree of vacuum, the amount of introduction and the time of introduction of the material gas, the substrate temperature and so on inside the reaction chamber by means of the generic high-vacuum CVD reactor, the monocrystalline thin line made of the semiconductor of the desired size can be uniformity formed with high reproducibility. Particularly by using the monocrystalline thin line made of the semiconductor for the channel region of a transistor, the region is quantized in the direction perpendicular to the direction in which the thin line extends to exhibit linear conduction in the semiconductor thin line, thereby suppressing the elastic scattering of electrons. Therefore, a super-high-speed transistor having the possibility of the achievement of an electron mobility of up to $10^6$ to $10^7$ cm$^2$/V·s can be materialized.

In an embodiment, the microstructure is made of silicon; and any one of monosilane (SiH$_4$), disilane (Si$_2$H$_6$), trisilane (Si$_3$H$_8$), dichlorosilane (SiH$_2$Cl$_2$) and tetrachlorosilane (SiCl$_4$) is used as the material gas.

According to the microstructure producing method of the above embodiment, by using any one of monosilane (SiH$_4$), disilane (Si$_2$H$_6$), trisilane (Si$_3$H$_8$), dichlorosilane (SiH$_2$Cl$_2$) and tetrachlorosilane (SiCl$_4$) as the material gas and inducing a reaction by means of the generic CVD reactor for the formation of the aforementioned microstructure made of silicon on the small-film-thickness region of the insulating thin film, the uniformity and reproducibility of the size and density of the microstructure are further improved.

In an embodiment, the microstructure is made of germanium; and any one of monogermane (GeH$_4$), digermane (Ge$_2$H$_6$) and germanium tetrafluoride (GeF$_4$) is used as the material gas.

According to the microstructure producing method of the above embodiment, by using any one of monogermane (GeH$_4$), digermane (Ge$_2$H$_6$) and germanium tetrafluoride (GeF$_4$) as the material gas and inducing a reaction by means of the generic CVD reactor for the formation of the aforementioned microstructure made of germanium on the small-film-thickness region of the insulating thin film, the uniformity and reproducibility of the size and density of the microstructure are further improved.

In an embodiment, the microstructure is made of silicon germanium; and a mixed gas of a gas of any one of monosilane (SiH$_4$), disilane (Si$_2$H$_6$), trisilane (Si$_3$H$_8$), dichlorosilane ($SiH_2Cl_2$) and tetrachlorosilane ($SiCl_4$) and a gas of any one of monogermane ($GeH_4$), digermane ($Ge_2H_6$) and germanium tetrafluoride ($GeF_4$) is used as the material gas.

According to the microstructure producing method of the above embodiment, by using the mixed gas of the gas of any one of monosilane ($SiH_4$), disilane ($Si_2H_6$), trisilane ($Si_3H_8$), dichlorosilane ($SiH_2Cl_2$) and tetrachlorosilane ($SiCl_4$) and the gas of any one of monogermane ($GeH_4$), digermane ($Ge_2H_6$) and germanium tetrafluoride ($GeF_4$) as the material gas and inducing a reaction by means of the generic CVD reactor for the formation of the aforementioned microstructure made of silicon germanium on the small-film-thickness region of the insulating thin film, the uniformity and reproducibility of the size and density of the microstructure are further improved.

A semiconductor device according to an embodiment is a semiconductor device provided with a source region, a drain region, a channel region located between the source region and the drain region, a gate region for controlling a channel current flowing through the channel region, a floating gate region located between the channel region and the gate region, a first insulating film located between the floating gate region and the gate region, and a second insulating film located between the channel region and the floating gate region, the floating gate region being a microstructure formed by the microstructure producing method.

According to the semiconductor device employing the microstructure of the above embodiment, by using the microstructure formed by the above microstructure producing method as the floating gate region, reduced accumulated electric charges result, so that the amount of electric charges to be injected into the floating gate region can be reduced, thereby allowing a nonvolatile memory having a low power consumption, a high density and a large capacity to be materialized. A nonvolatile memory that ensures low cost, high yield and high productivity and is appropriate for mass-production can be materialized. Furthermore, the semiconductor device employing the microstructure of the present invention can be mounted on a substrate identical to that of an Si-based large-scale integrated circuit as a semiconductor device having a quantum dot or a quantum thin line, which is the basis of the single-electron device.

A semiconductor device employing the microstructure of an embodiment is a semiconductor device provided with a source region, a drain region, a channel region lo cat ed between the source region and the drain region, a gate region for controlling a channel current flowing through the channel region, and a gate insulating film located between the channel region and the gate region, the channel region being a thin line made of a semiconductor formed by the microstructure producing method.

According to the semiconductor device employing the microstructure of the above embodiment, by using the thin line made of the semiconductor formed by the above microstructure producing method as the channel region, the channel region is quantized in the direction perpendicular to the direction in which the thin line extends to exhibit linear conduction. Therefore, a transistor capable of operating at super-high speed can be obtained, so that a super-high-speed transistor that ensures low cost, high yield and high productivity and is appropriate for mass-production can be materialized. The semiconductor device employing the microstructure of the present invention can be mounted on a substrate identical to that of an Si-based large-scale integrated circuit as a semiconductor device having a quantum thin line, which is the basis of the quantum-effect device.

A semiconductor device employing the microstructure of an embodiment is a semiconductor device provided with a minute particle made of a semiconductor formed by the microstructure producing method, insulating films that are formed so as to put the minute particle between the insulating films and electrodes that are formed so as to further put the insulating films between the electrodes, the minute particle emitting light by applying a voltage across the electrodes.

According to the semiconductor device employing the microstructure of the above embodiment, by putting the minute particle made of the semiconductor formed by the above microstructure producing method between the insulating films and further putting the insulating films between the electrodes, the minute particle comes to have a direct transition type band structure. If an electron is injected into the minute particle by forming a tunnel current with a voltage applied across the electrodes, then an electron transition occurs in the minute particle, consequently emitting light. Therefore, a light-emitting device that ensures low cost, high yield and high productivity and is appropriate for mass-production can be materialized. The semiconductor device employing the microstructure of the present invention can be mounted on a substrate identical to that of an Si-based large-scale integrated circuit as a semiconductor device having a quantum dot, which is the basis of the quantum-effect device. By applying this semiconductor device to a light-emitting device or a photoelectric transducer, the integration of an electronic circuit with an optical communication circuit can be achieved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1A, 1B, 1C, 1D and 1E are views showing the growth process of a microstructure, or minute particles;

FIG. 8A is a sectional view taken along the line VIII—VIII in FIG. 6;

FIG. 8B is a sectional view taken along the line VIII—VIII in FIG. 6 in the case where minute particles are employed;

FIG. 9A is a plan view of a MOSFET that serves as a semiconductor device employing a microstructure according to a fifth embodiment of the present invention;

FIG. 9B is a sectional view taken along the line B—B in FIG. 9A;

FIG. 9C is a sectional view taken along the line C—C in FIG. 9A;

FIG. 18 is a sectional view taken along the line XVIII—XVIII in FIG. 16;

FIG. 19A is a plan view of a MOSFET that serves as a semiconductor device employing a microstructure according to a ninth embodiment of the present invention;

FIG. 19B is a sectional view taken along the line B—B in FIG. 19A;

FIG. 19C is a sectional view taken along the line C—C in FIG. 19A;

DETAILED DESCRIPTION OF THE PREFERRED EMBODIMENTS

Figure 2A:
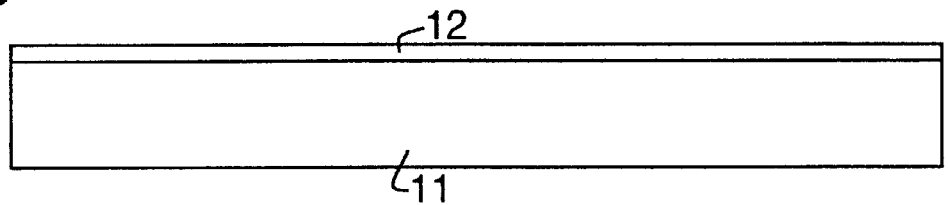
FIGS. 2A, 2B, 2C and 2D are process charts showing a microstructure producing method according to a first embodiment of the present invention.

The microstructure forming method and semiconductor device employing the microstructure of the present invention will be described in detail below on the basis of the embodiments shown in the drawings.

The present applicant found through experiments the fact that a minute particle or a thin line is selectively formed only in a region having a small film thickness when there is a difference in film thickness of the insulating thin film formed on a semiconductor substrate surface. Before explaining the embodiments, first, the selective growth of the minute particle or the thin line will be described below.

FIGS. 1A through 1E show the growth process when Si minute particles are made to grow in a region 2a of a great film thickness and a region 2b of a small film thickness of an oxide film 2 that serves as an insulating thin film formed on the surface of a silicon substrate 1.

First, if the silicon substrate 1 on the surface of which the oxide film 2 having the great-film-thickness region 2a and the small-film-thickness region 2b is formed is placed in a reaction chamber and a small amount of reaction gas flow is made in an environment of high vacuum and high purity, then the gas molecules, which might adhere to the surface of the oxide film 2, will separate before long while moving on the surface within an initial time, or the so-called time of latency, and consequently nothing is formed on the surface of the oxide film 2 (FIG. 1A). Subsequently, when the time of latency elapses and a core is formed on the surface of the oxide film 2, a minute particle 3 is formed around the core (FIG. 1B). This time of latency depends on the film thickness of the oxide film 2, or the base insulating film. The smaller the film thickness is, the shorter the time of latency is. Therefore, a minute particle 3a is firstly selectively formed in the small-film-thickness region 2b of the oxide film 2 (FIG. 1C). This is presumably attributed to the occurrence of epitaxial growth reflecting the crystallinity of the silicon substrate 1 via the oxide film 2 when the film thickness of the oxide film 2 is reduced, or attributed to the fact that the state of the surface of the small-film-thickness region of the oxide film 2 is the so-called singular point different from the great-film-thickness region. Subsequently, with the lapse of time, a minute particle 4 is formed also in the great-film-thickness region 2a of the oxide film 2 as shown in FIGS. 1D and 1E, and there is also a grown minute particle 3b on the small-film-thickness region 2b side (FIG. 1D). Then, if the growth continues, a minute particle 4a is grown on the great-film-thickness region 2a side of the oxide film 2, while a minute particle 3c is grown on the small-film-thickness region 2b side (FIG. 1E). It is possible to selectively grow an Si thin line similar to the above growth process by forming the small-film-thickness region 2b of the oxide film 2 into a linear shape.

As described above, the microstructure (minute particle or thin line) can be selectively formed by the difference in film thickness of the insulating thin film formed on the semiconductor substrate surface, and the embodiments of a microstructure producing method and a semiconductor device employing the microstructure taking advantage of this feature will be described next.

FIRST EMBODIMENT

FIGS. 2A through 2D are process charts for explaining the microstructure producing method of the first embodiment of the present invention.

First, as shown in FIG. 2A, the surface of a silicon substrate 11 is oxidized, thereby forming an oxide film 12 having a film thickness of 7 nm.

Figure 2B:
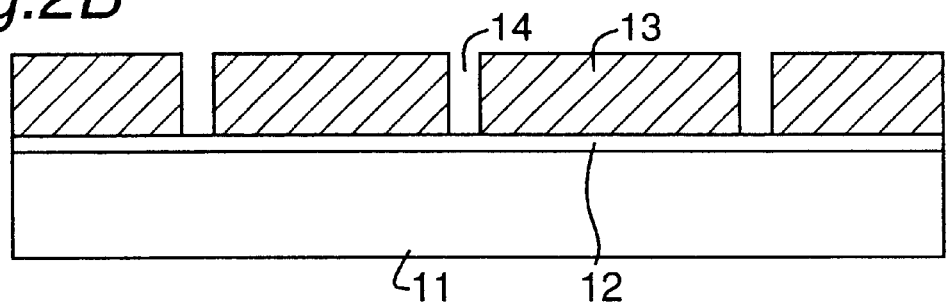

Next, as shown in FIG. 2B, a resist pattern 13 having a removal region 14 having a width of 20 nm is formed by the electron beam lithography technique.

Figure 2C:
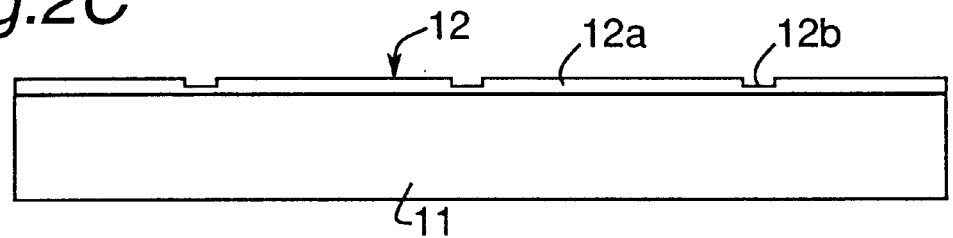

Next, as shown in FIG. 2C, the oxide film 12 is etched by dilute hydrofluoric acid having a concentration of 0.5% until the remaining film comes to have a thickness of 2 nm to thereby form a small-film-thickness region 12b, and thereafter the resist pattern 13 is removed.

Figure 2D:
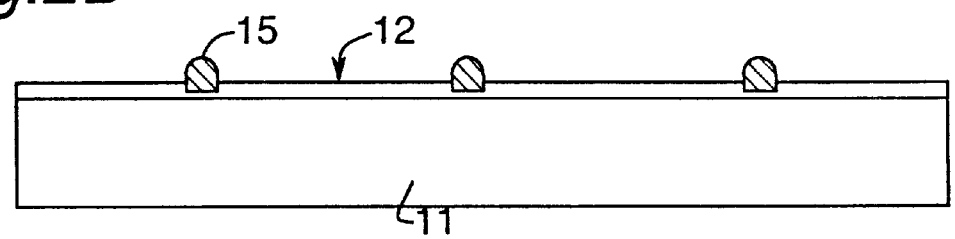

Then, as shown in FIG. 2D, the whole substrate is placed in a reaction chamber equivalent to the high-vacuum CVD (Chemical Vapor Deposition) reactor, and thereafter the reaction chamber is evacuated to produce a vacuum of about $10^{-8}$ Torr. Thereafter, disilane ($Si_2H_6$) is made to flow at a rate of 18 sccm for 120 seconds with the substrate temperature set to 590° C., thereby selectively growing an Si crystal only in the portion having the oxide film thickness of 2 nm (small-film-thickness region 12b). By this operation, a thin line 15 having a width of 20 nm and a height of 9 nm is formed.

As described above, the thin line 15 that serves as a microstructure made of silicon Si is selectively formed only in the small-film-thickness region 12b of the oxide film 12 that serves as the insulating thin film to be the base. Therefore, by controlling the position in which the small-film-thickness region 12b of the oxide film 12 is formed, the growth position control of the thin line 15 can be achieved, and the uniformity and reproducibility of the size and density of the thin line 15 become satisfactory. There can also be achieved the microstructure producing method that is able to produce the microstructure at low cost through simple processes without using any specific microfabrication technique and is appropriate for mass-production ensuring high yield and high productivity.

By virtue of the processes of forming the oxide film 12 on the surface of the silicon substrate 11 and thereafter reducing in thickness only the partial region of the oxide film 12 by etching, the small-film-thickness region 12b can be easily formed on the oxide film 12 through the simple processes.

By introducing the silicon substrate 11, on which the oxide film 12 is formed, into a reaction chamber, thereafter produce a high vacuum of not greater than $10^{-6}$ Torr inside the reaction chamber for the discharge of the atmospheric components and impurities such as moisture, thereafter making a material gas flow inside the reaction chamber and producing a material gas partial pressure of not greater than $10^{-2}$ Torr, the epitaxial growth of the thin line 15 can be stimulated only in the small-film-thickness region 12b of the oxide film 12 that serves as the base. If the material gas partial pressure in the reaction stage exceeds $10^{-2}$ Torr, then film growth immediately starts throughout the entire surface of the insulating thin film, so that the selective growth cannot be achieved.

By forming the openings of the resist pattern into discrete minute circles according to the microstructure producing method of the first embodiment, minute particles can also be selectively formed only in the small-film-thickness region 12b of the oxide film 12. By thus controlling the shape and size of the openings of the resist pattern, the crystal shape and size of the microstructure can be controlled.

SECOND EMBODIMENT

FIGS. 3A through 3E are process charts for explaining the microstructure producing method of the second embodiment of the present invention.

Figure 3A:
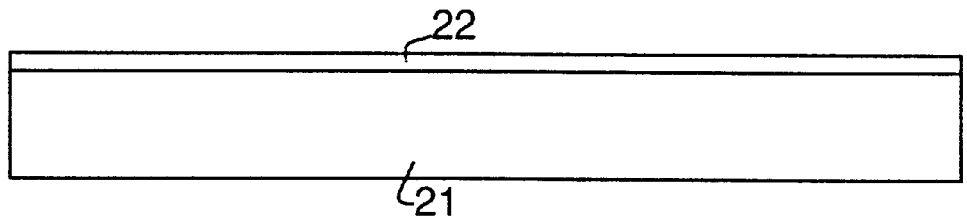
FIGS. 3A, 3B, 3C, 3D and 3E are process charts showing a microstructure producing method according to a second embodiment of the present invention.

First, as shown in FIG. 3A, the surface of a silicon substrate 21 is oxidized, thereby forming an oxide film 22 that serves as a first portion having a film thickness of 6 nm. Even if an insulating film of $SiO_2$, $Si_3N_4$ or the like or a laminate insulating film is deposited on the silicon substrate 21 by the CVD method, the growth of the thin line as described below does not substantially change.

Figure 3B:
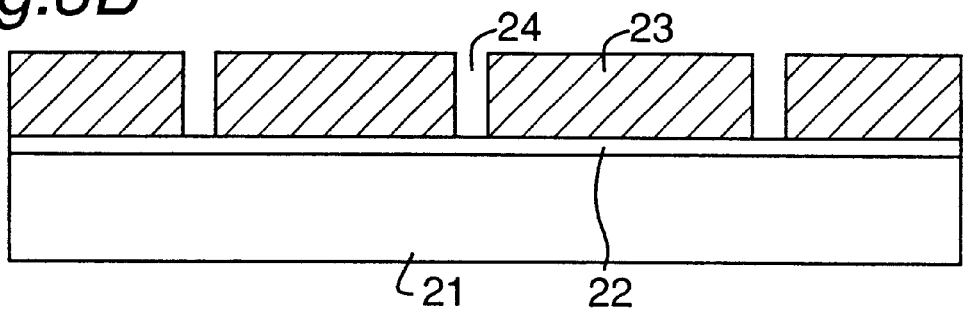

Next, as shown in FIG. 3B, a resist pattern 23 having a removal region 24 having a width of 20 nm is formed by the electron beam lithography technique.

Figure 3C:
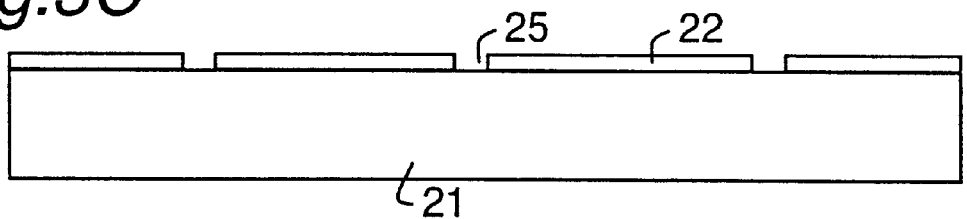

Next, as shown in FIG. 3C, the oxide film 22 is etched until the surface of the silicon substrate 21 is exposed by the dry etching method, thereby forming an exposed region 25.

Figure 3D:
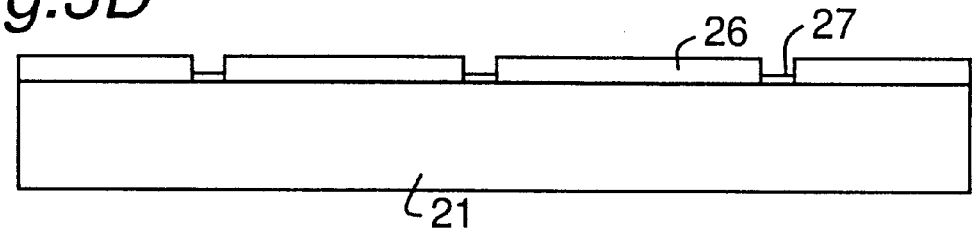

Next, as shown in FIG. 3D, by removing the resist pattern 23 and thereafter oxidizing again the same, a thin oxide film 27 having a film thickness of 2 nm is formed as a second portion in the exposed region of the Si surface. In this stage, the oxide film 22 (shown in FIG. 3C) that has not been etched becomes an oxide film 26 that has a film thickness of 7 nm and serves as a first portion. Even if an insulating film of $SiO_2$, $Si_3N_4$ or the like or a laminate insulating film is deposited to a thickness of 2 nm on the silicon substrate 21 by the CVD method, the growth of the thin line as described below does not substantially change. However, it is often the case where a thin film produced by the CVD method comes to have a great film thickness capable of achieving the selective growth, and the selective growth can be achieved with a film thickness of up to 5 nm.

Figure 3E:
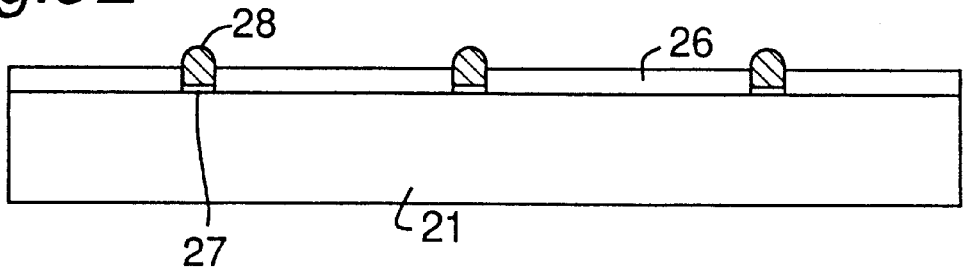

Then, as shown in FIG. 3E, the whole substrate is placed in a reaction chamber equivalent to the high-vacuum CVD reactor, and the reaction chamber is evacuated so as to produce a vacuum of about $10^{-8}$ Torr inside the reaction chamber. Thereafter, disilane ($Si_2H_6$) is made to flow at a rate of 18 sccm for 120 seconds with the substrate temperature set to 590° C., thereby selectively growing an Si crystal only in the small-film-thickness region (oxide film 27). By this operation, a thin line 28 having a width of 20 nm and a height of 9 nm is formed.

As described above, the thin line 28 that is the microstructure made of silicon Si is selectively formed only in the small-film-thickness oxide film 27 that is the insulating thin film to be the base. Therefore, by controlling the position in which the small-film-thickness oxide film 27 is formed, the growth position control of the thin line 28 can be achieved, and the uniformity and reproducibility of the size and density of the thin line 28 become satisfactory. There can also be achieved the microstructure producing method that is able to produce the microstructure at low cost through simple processes without using any specific microfabrication technique and is appropriate for mass-production ensuring high yield and high productivity.

By once forming the oxide film 22 that serves as the first portion on the silicon substrate 21 and removing only the partial region of the oxide film 22 for partially exposing the surface of the silicon substrate 21 and thereafter forming the oxide film 27 that serves as the second portion on the surface of the silicon substrate 21 from which the oxide film 22 has been removed, the small-film-thickness region (oxide film 27) can be easily formed on the surface of the silicon substrate 21.

By virtue of the formation of the oxide film 27 that serves as the second portion through oxidization of the exposed region of the surface of the silicon substrate 1, the oxide film 27 having the small film thickness can be obtained through the simple processes. It is also acceptable to deposit the second portion on the exposed region of the surface of the silicon substrate 21, thereby forming the small-film-thickness region.

It is also acceptable to selectively form minute particles only in the small-film-thickness region of the oxide film 22 by forming the openings of the resist pattern into discrete minute circles according to the microstructure producing method of the second embodiment. By thus controlling the shape and size of the openings of the resist pattern, the crystal shape and size of the microstructure can be controlled.

THIRD EMBODIMENT

Figure 4A:
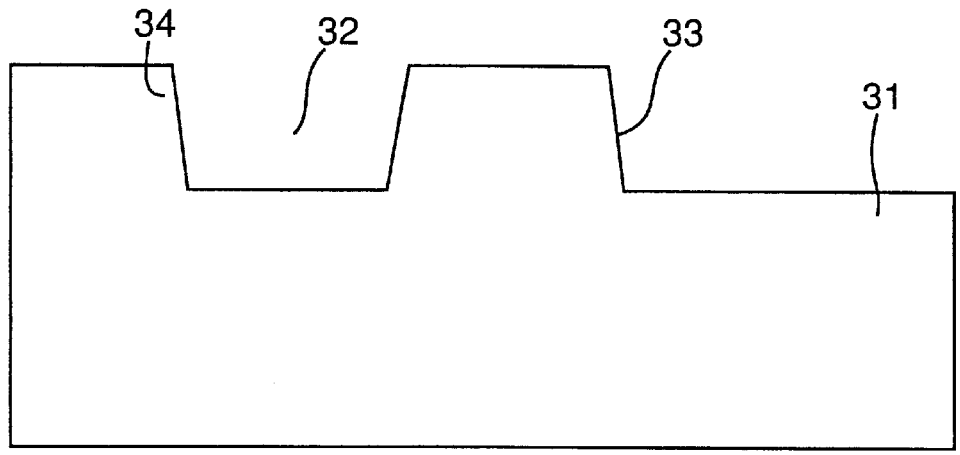
FIGS. 4A, 4B and 4C are process charts showing a microstructure producing method according to a third embodiment of the present invention.
Figure 4B:
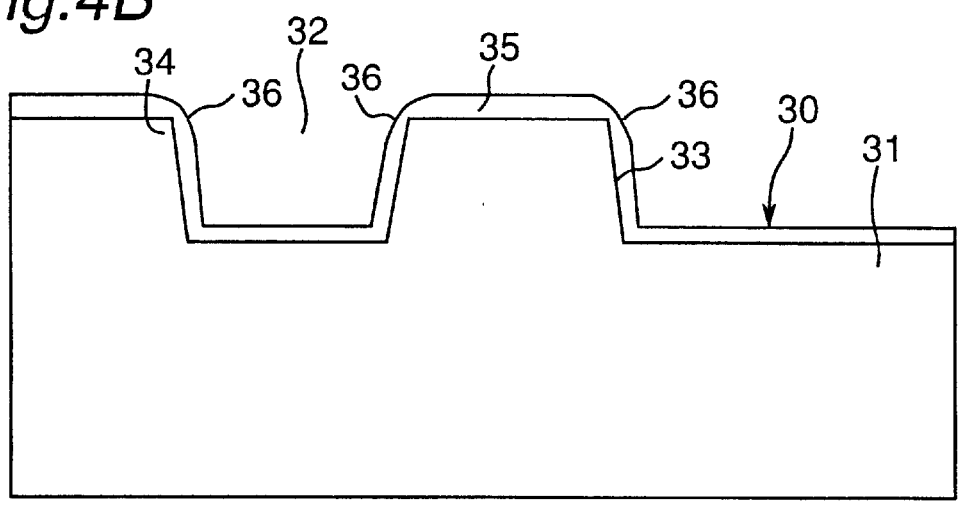
Figure 4C:
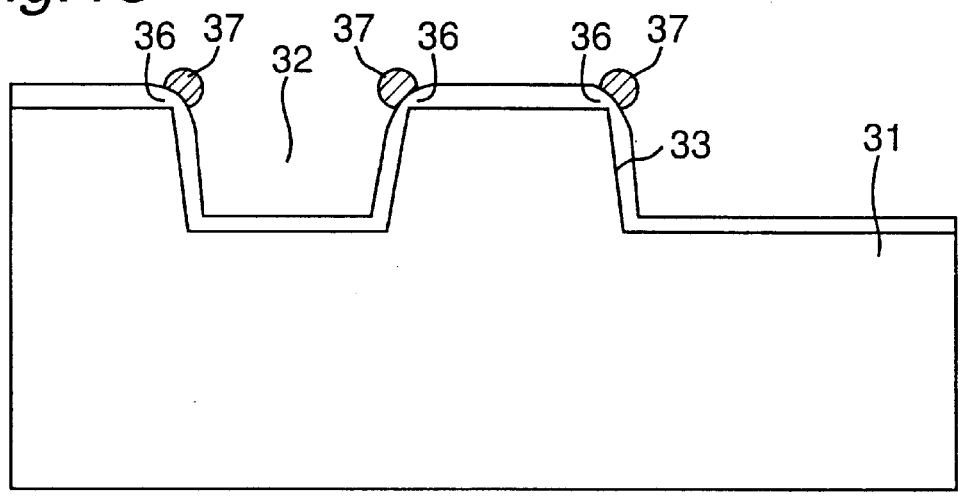

FIGS. 4A through 4C are process charts for explaining the microstructure producing method of the third embodiment of the present invention.

First, as shown in FIG. 4A, a groove 32 and a stepped portion 33 are formed by means of the dry etching method.

Next, as shown in FIG. 4B, a silicon substrate 31 is oxidized to form an oxide film 30 on the surface of the silicon substrate 31. In this stage, with regard to the oxide film 30, a flat portion becomes a great-film-thickness region 35 having a film thickness of 6 nm, while the upper ends of both side walls of the groove 32 and the upper end corner edge portion 34 of the stepped portion 33 become a small-film-thickness region 36 having a film thickness of 2 nm, which is thinner than the great-film-thickness region 35. This is because the release of stress does not progress in the edge portion 34 during oxidation and the oxide film thickness becomes smaller than the other portion. This tendency becomes more significant as the oxidation temperature is lowered. In this case, the edge portion means the end, edge, stepped portion corner, sharp portion, blade edge or the like and is limited neither to the upper ends of both side walls of the groove nor to the upper end corner portion of the stepped portion.

Next, as shown in FIG. 4C, the whole substrate is placed in a reaction chamber equivalent to the high-vacuum CVD reactor, and thereafter the reaction chamber is evacuated so as to produce a vacuum of about $10^{-8}$ Torr. Thereafter, disilane ($Si_2H_6$) is made to flow at a rate of 18 sccm for 120 seconds with the substrate temperature set to 590° C., thereby forming a thin line 37 along the upper ends of both side walls of the groove 32 and the upper end corner portion of the stepped portion 33 (in the direction perpendicular to the sheet plane of FIG. 4).

Figure 5:
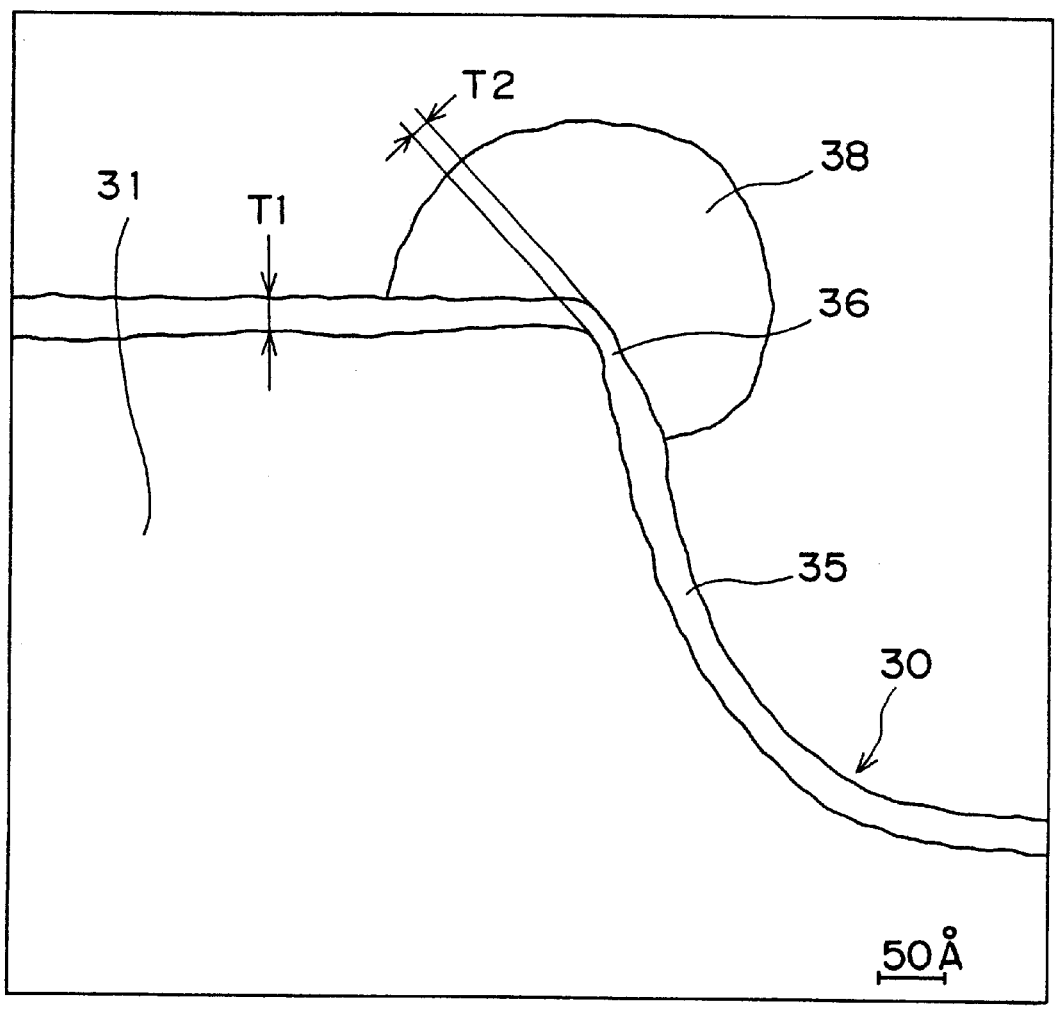
FIG. 5 is an enlarged sectional view of a minute particle produced by the microstructure producing method of the above third embodiment.

By changing the growth conditions, a minute particle can be formed in place of the thin line. FIG. 5 shows an enlarged view in the case where an Si minute particle 38 having a size of about 30 nm is made to grow by further reducing the film thickness of the oxide film by the microstructure producing method of this third embodiment. In this case, the thick region of the oxide film 30 had a film thickness T1 of about 30 angstroms, while the thin region 36 had a film thickness T2 of about 15 angstroms.

Although the upper ends of both side walls of the groove and the upper end corner portion of the stepped portion have been described in regard to the edge portion with reference to FIGS. 4A through 4C, the edge portion may also have a sharp shape of a needle-like or knife-blade-edge-like shape obtained in the case where etching is effected with a minute dot-shaped or a fine linear pattern used as a mask when dry-etching the silicon substrate, as another shape.

According to the above microstructure producing method, the oxide film (thin region 36) thinner than the other portion (thick region 35) can be easily formed in the edge portion 34 by oxidizing the surface of the silicon substrate 31 on which the edge portion 34 has preliminarily been formed.

FOURTH EMBODIMENT

Figure 6:
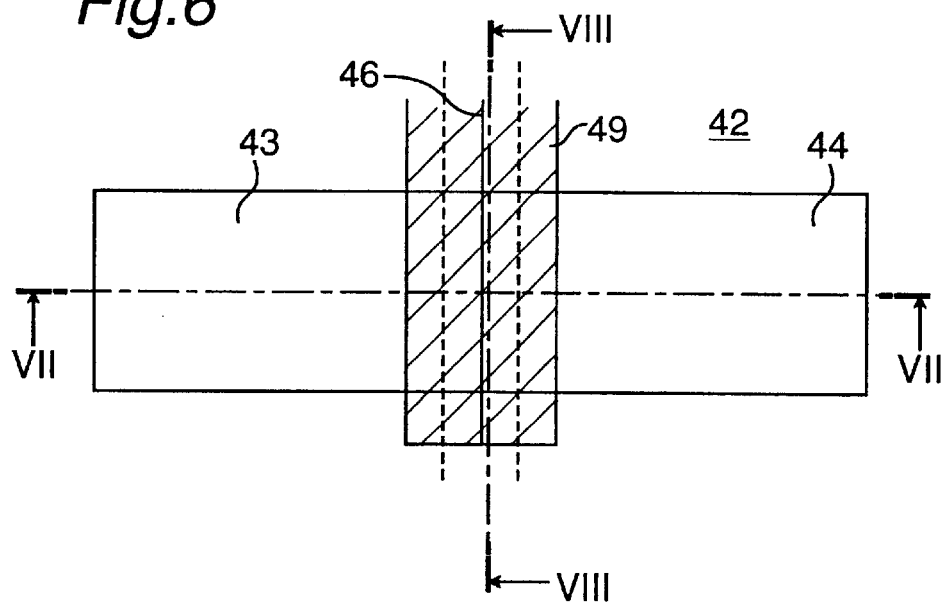
FIG. 6 is a plan view of a nonvolatile memory that serves as a semiconductor device employing a microstructure according to a fourth embodiment of the present invention.
Figure 7:
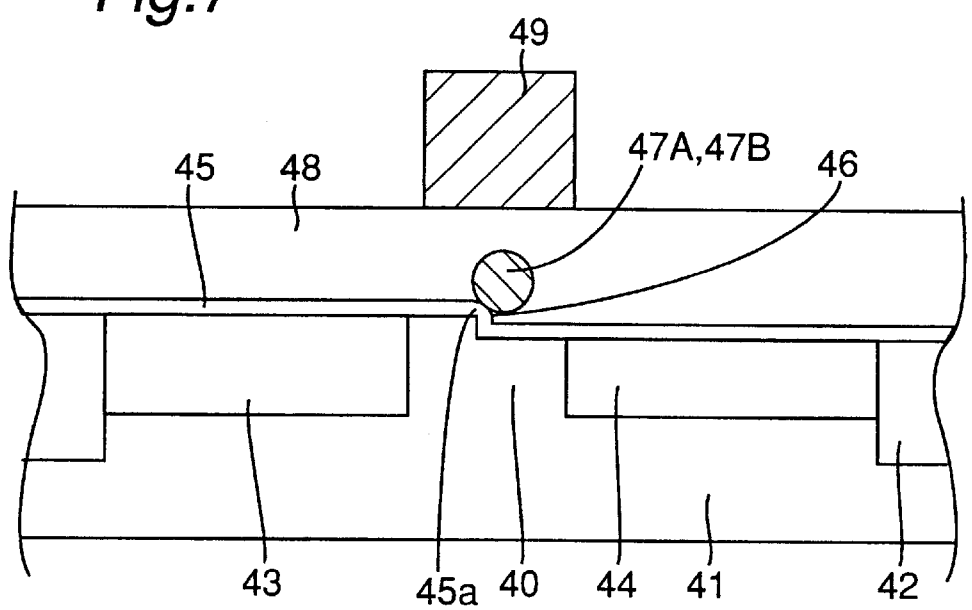
FIG. 7 is a sectional view taken along the line VII—VII in FIG. 6.

FIG. 6 shows a plan view of a nonvolatile memory (flash EEPROM or the like) that serves as a semiconductor device employing the microstructure of the fourth embodiment of the present invention. FIG. 7 is a sectional view taken along the line VII—VII in FIG. 6.

As shown in FIG. 6 and FIG. 7, a rectangular region surrounded by an element isolation region 42 is formed on a silicon substrate 41, and a stepped portion 46 is formed in the direction approximately perpendicular to the lengthwise direction approximately at the center of the above region. Thereafter, the silicon substrate 41 is oxidized to form a tunnel insulating film 45 that serves as a second insulating film. Then, the tunnel insulating film 45 at the upper end corner portion of the stepped portion 46 becomes a region 45a having a film thickness smaller than that of the other portion. In this stage, the thin region 45a of the tunnel insulating film 45 comes to have a film thickness of 2 nm. Then, a nanometer-size thin line 47A is formed as a floating gate region on the thin region 45a of the tunnel insulating film 45 by the thin line producing method of the third embodiment. Subsequently, a control gate insulating film 48 that serves as a first insulating film and has a film thickness of 10 nm is formed on the tunnel insulating film 45 and the thin line 47A by the CVD method. Then, a gate electrode 49 is formed on the control gate insulating film 48, and thereafter impurity ions are injected with the gate electrode 49 used as a mask, thereby forming source and drain regions 43 and 44 on the silicon substrate 41. A region that corresponds to the gate electrode 49 and is located between the source region 43 and the drain region 44 becomes an active region 40. As described above, the nonvolatile memory employing the thin line 47A in the floating gate region located between the active region 40 and the gate electrode 49 is constructed.

FIG. 8A is a sectional view taken along the line VIII—VIII in FIG. 6, where the thin line 47A is arranged so as to be approximately perpendicularly intersecting to the direction in which the source region 43 and the drain region 44 are arranged as shown in FIG. 6.

If minute particles are formed in place of the thin line in FIGS. 6 and 7, then as shown in FIG. 8B taken along the line VIII–VIII in FIG. 6, a plurality of minute particles 47B are arranged perpendicularly to the direction in which the source region 43 and the drain region 44 (shown in FIG. 6) are arranged.

As described above, by employing the thin line 47A or the minute particles 47B, each of which is the microstructure, in the floating gate region, the electric charges accumulated in the floating gate region can be reduced. Therefore, a nonvolatile memory having a very small power consumption, a super-high density and a large capacity can be materialized.

By employing the thin line 47A or the minute particles 47B made of silicon Si formed by the above microstructure producing method, a nonvolatile memory or the like that ensures low cost, high yield and high productivity and is appropriate for mass-production can be materialized.

The microstructure of the thin line or the minute particle may be formed by the microstructure producing method of the first embodiment or the second embodiment. The material of the thin line or the minute particle is not limited to the semiconductor, and the material may be a metal.

FIFTH EMBODIMENT

FIG. 9A shows a plan view of a MOS (Metal Oxide Semiconductor) FET (Field-Effect Transistor) that serves as a semiconductor device employing the microstructure of the fifth embodiment of the present invention. FIG. 9B shows a sectional view taken along the line B—B in FIG. 9A. FIG. 9C shows a sectional view taken along the line C—C in FIG. 9A As shown in FIGS. 9A through 9C, a stepped portion 53 is formed on a silicon substrate 51, and thereafter the silicon substrate 51 is oxidized to form an insulating film 52. Then, the film thickness of the insulating film 52 at the upper end corner portion of the stepped portion 53 becomes smaller than that of the other portion. Then, by using the microstructure producing method of the third embodiment, a thin line 54 made of a nanometer-size semiconductor is formed only in a portion along a small-film-thickness region 52a on the stepped portion 53 of the insulating film 52. Subsequently, a gate insulating film 55 having a film thickness of 30 nm is formed on the insulating film 52 and the thin line 54 by the CVD method. Then, a gate electrode 56 is formed on the gate insulating film 55, and thereafter impurity ions are injected with the gate electrode 56 used as a mask, thereby forming source and drain regions 57 and 58 on the thin line 54. A portion between the source region 57 and the drain region 58 of the thin line 54 becomes a channel region 59. Then, by making the thin line 54 have a width of not greater than several tens of nanometers, the channel region 59 is quantized in the direction perpendicular to the direction in which the thin line 54 extends to exhibit linear conduction, so that a high-speed MOSFET can be obtained.

As described above, by employing in the channel region 59 part of the thin line 54 that is the microstructure made of silicon Si, a super-high-speed transistor or the like that ensures low cost, high yield and high productivity and is appropriate for mass-production can be materialized.

It is to be noted that the microstructure producing method of the first or second embodiment may be used for the formation of the thin line 54.

SIXTH EMBODIMENT

Figure 10:
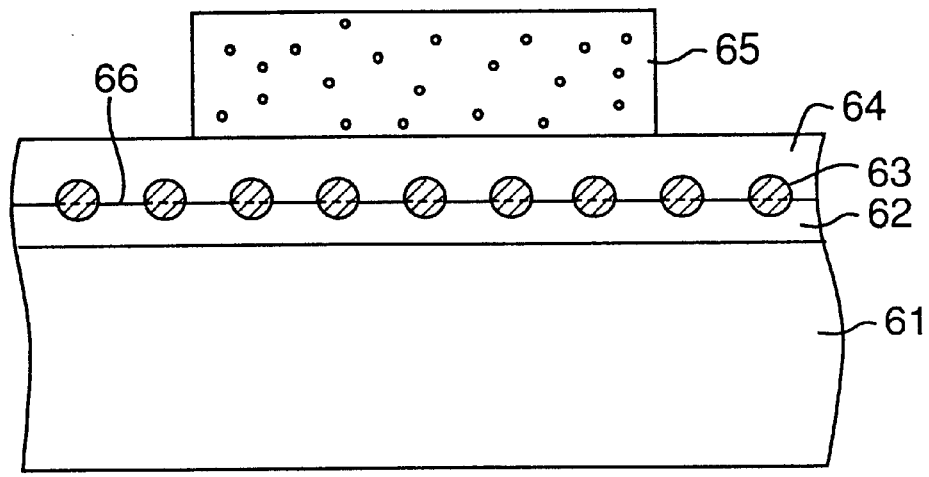
FIG. 10 is a plan view of a light-emitting device that serves as a semiconductor device employing a microstructure according to a sixth embodiment of the present invention.

FIG. 10 shows a sectional view of a light-emitting device that serves as a semiconductor device employing the microstructure of the sixth embodiment of the present invention.

As shown in FIG. 10, a stepped portion 66 is formed on a silicon substrate 61, and thereafter the silicon substrate 61 is oxidized to form an insulating film 62. The film thickness of the insulating film 62 at the upper end corner portion of the stepped portion 66 becomes smaller than that of the other portion. Then, by using the microstructure producing method of the third embodiment, a plurality of minute particles 63 having a diameter of several tens of nanometers are formed along the small-film-thickness region on the stepped portion 66 of the insulating film 62. Thereafter, a gate insulating film 64 having a film thickness of 30 nm is formed on the insulating film 62 and the minute particles 63 by the CVD method. Further, a transparent gate electrode (ITO: Indium Tin Oxide) 65 is formed on the gate insulating film 64. By putting the minute particles 63 between the insulating films 62 and 64 and further putting the insulating films 62 and 64 between the silicon substrate 61 and the transparent electrode 65, the minute particles 63 come to have a direct transition type band structure. Then, by applying a voltage across the transparent electrode 65 and the silicon substrate 61, a tunnel current flows between the insulating film 62 and the gate insulating film 64. Electrons are injected into the minute particles 63 by the tunnel current, and an electron transition occurs in the minute particles 63, thus emitting light.

By employing the minute particles 63 made of silicon Si, a light-emitting device that ensures low cost, high yield and high productivity and is appropriate for mass-production can be materialized.

The microstructure producing method of the first or second embodiment may be used for the formation of the minute particles 63.

The present inventors found a further method for forming an insulating thin film in the region other than the edge portion on the semiconductor substrate surface on which the edge portion is formed and selectively forming a thin line only on the semiconductor surface of the edge portion. First, this selective growth of the thin line will be described below.

FIGS. 11A through 11D show a growth process in the case where an Si thin line is made to grow on the semiconductor surface of an edge portion 103 formed on the surface of a silicon substrate 101.

Figure 11A:
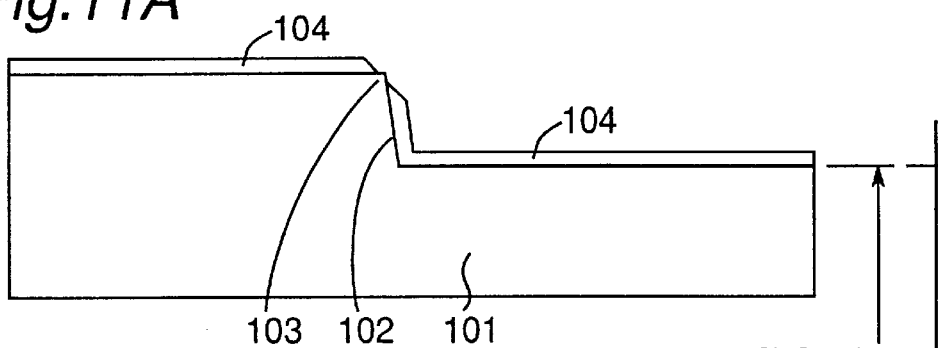
FIGS. 11A, 11B, 11C and 11D are views showing the growth process of a thin line constructed of a semiconductor according to the microstructure producing method of the present invention.
Figure 11B:
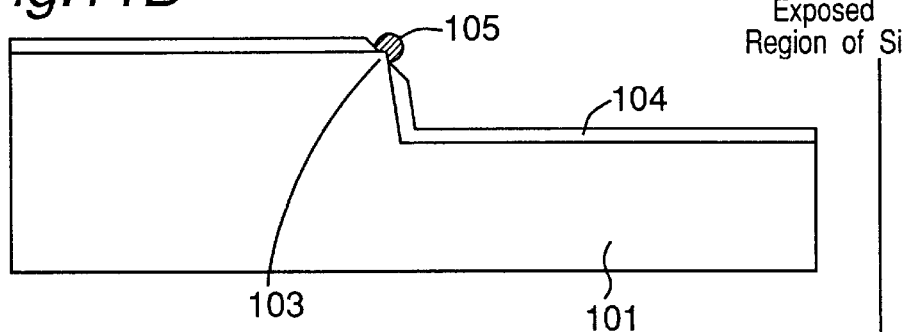
Figure 11C:
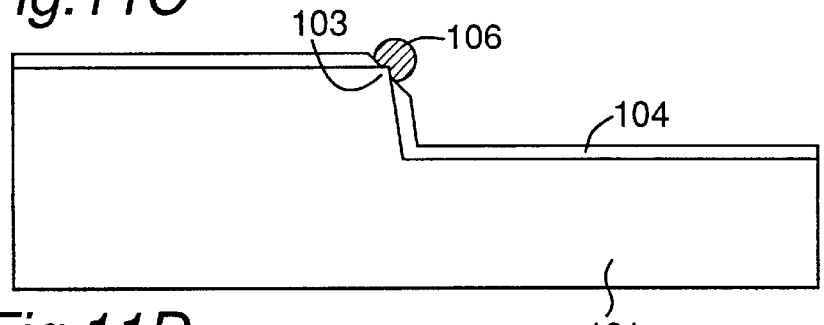
Figure 11D:
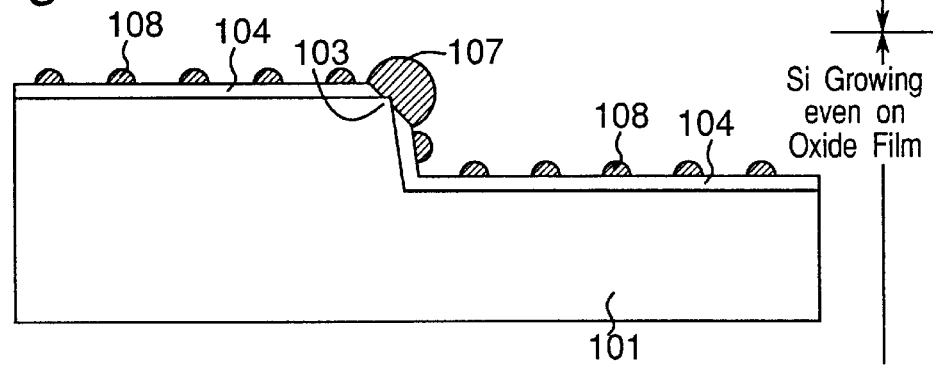

First, the silicon substrate 101 having an oxide film 104 formed in a region except for a stepped portion 102 and the edge portion 103 is placed in a reaction chamber, and a small amount of reaction gas is made to flow in an environment of high vacuum and high purity. In this case, the gas molecules, which might adhere to the surface of the oxide film 104, will separate before long while moving on the surface within an initial time, or the so-called time of latency, and consequently nothing is formed on the surface of the oxide film 104 (FIG. 11A). Within this time of latency, a minute crystal 105 grows on the surface of the edge portion 103 (FIG. 11B) and a thin line 106 is selectively made to epitaxially grow only in the exposed portion of the edge portion 103 where the semiconductor surface is exposed (FIG. 11C). Subsequently, with the lapse of time, a minute particle 108 is also formed on the surface of the oxide film 104 as shown in FIG. 11D, and there is also a grown minute thin line 107 on the surface side of the edge portion 103 (FIG. 11D).

Figure 12:
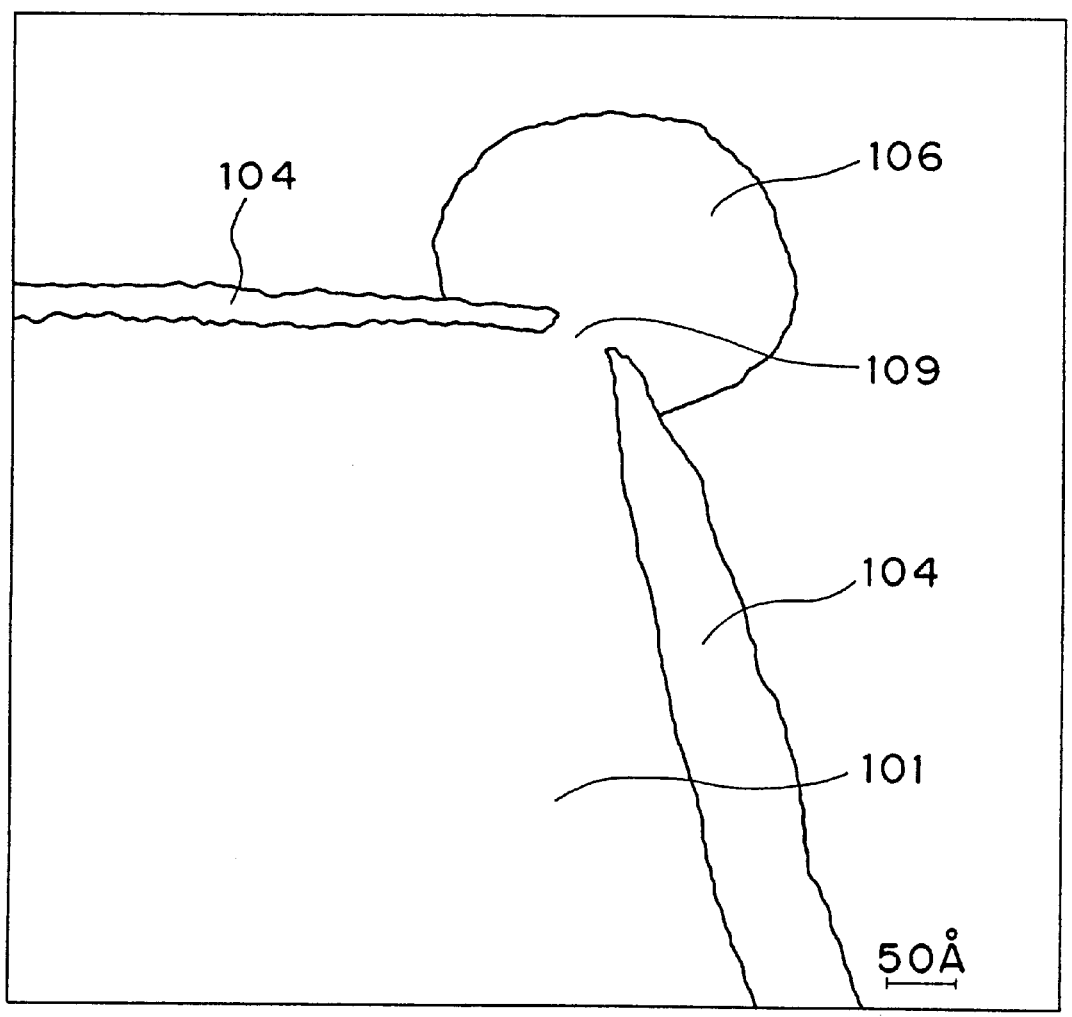
FIG. 12 is an enlarged sectional view of the essential part of FIG. 11A.

FIG. 12 shows an enlarged sectional view of the essential part of FIG. 11C, where the edge portion 103 (shown in FIGS. 11A through 11D) formed on the silicon substrate 101 becomes a connecting region 109 of the thin line 106 and the silicon substrate 101.

As described above, the microstructure (thin line) can be selectively formed in the edge portion formed on the semiconductor surface. A microstructure producing method utilizing this feature and a semiconductor device employing the microstructure will be described next.

SEVENTH EMBODIMENT

Figure 13A:
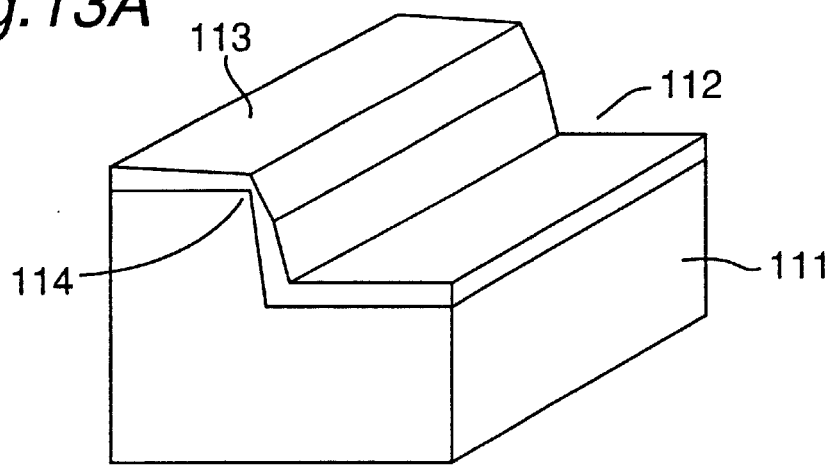
FIGS. 13A, 13B and 13C are perspective views showing the processes of a thin line constructed of a semiconductor formed by a microstructure producing method according to a seventh embodiment of the present invention.
Figure 13B:
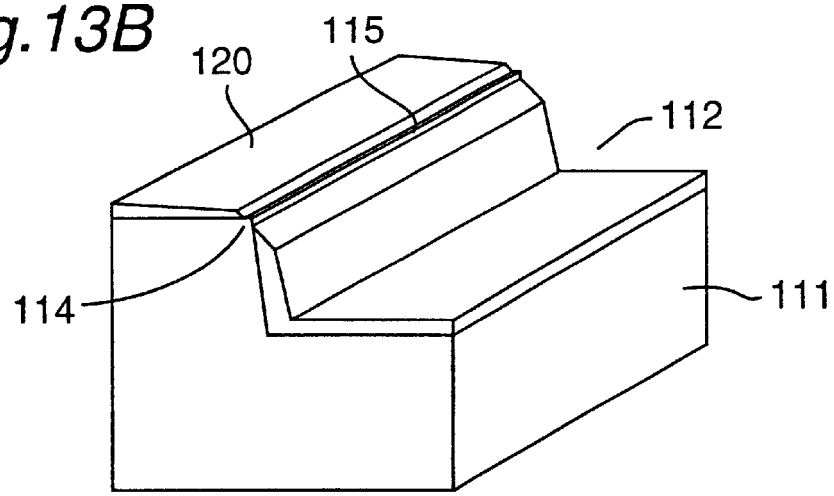
Figure 13C:
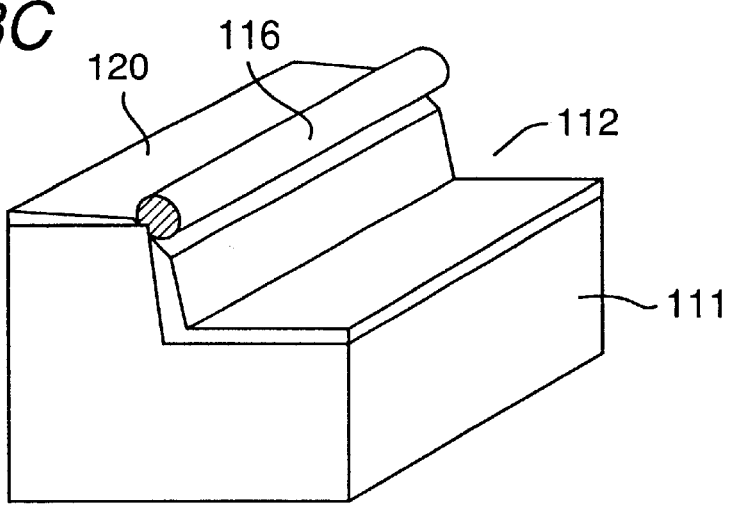

FIGS. 13A through 13C are perspective views showing the processes of a thin line constructed of a semiconductor formed by the microstructure producing method of the seventh embodiment of the present invention.

First, as shown in FIG. 13A, a groove 112 (having a depth of 500 Å) is formed on a silicon substrate 111 by the generic photolithography technique and dry-etching technique.

Next, a thermally oxidized film 113 (whose flat portion has a film thickness of 7 nm) is formed on the surface of the silicon substrate 111. In this stage, an oxide film at an edge portion 114 located at the upper end corner portion of the groove 112 has a film thickness of 5 nm, which is thinner than that of the other portion. In this case, the edge portion means the end, edge, stepped portion corner, blade edge or the like and is limited neither to the upper ends of both side walls of the groove nor to the upper end corner portion of the stepped portion. For example, the edge portion may also have a sharp shape of a needle-like or knife-blade-edge-like shape obtained in the case where etching is effected with a minute dot-shaped or a fine linear pattern used as a mask when dry-etching the silicon substrate.

Next, as shown in FIG. 13B, the thin film portion of the oxide film 113 is removed. That is, if it is assumed that the oxide film thickness of the flat portion is a 1.5-nm thick thermally oxidized film 120 obtained by etching the oxide film 113 by 5.5 nm, then the surface of the silicon substrate 111 is exposed in a 5-nm wide linear region 115 along the edge portion 114 of the upper end corner portion of the groove 112.

Then, the substrate shown in FIG. 13B is placed in the reaction chamber of a high-vacuum CVD reactor, and thereafter the reaction chamber is evacuated so as to produce a vacuum of about $10^{-8}$ Torr. Thereafter, by making disilane ($Si_2H_6$) flow at a rate of 18 sccm for 60 seconds with the substrate temperature set to 590° C., Si is selectively made to epitaxially grow only in the linear region 115 (shown in FIG. 13B) where the silicon substrate 111 is exposed as shown in FIG. 13C. By this operation, an Si thin line 116 having a width of 10 nm is formed.

Figure 14A:
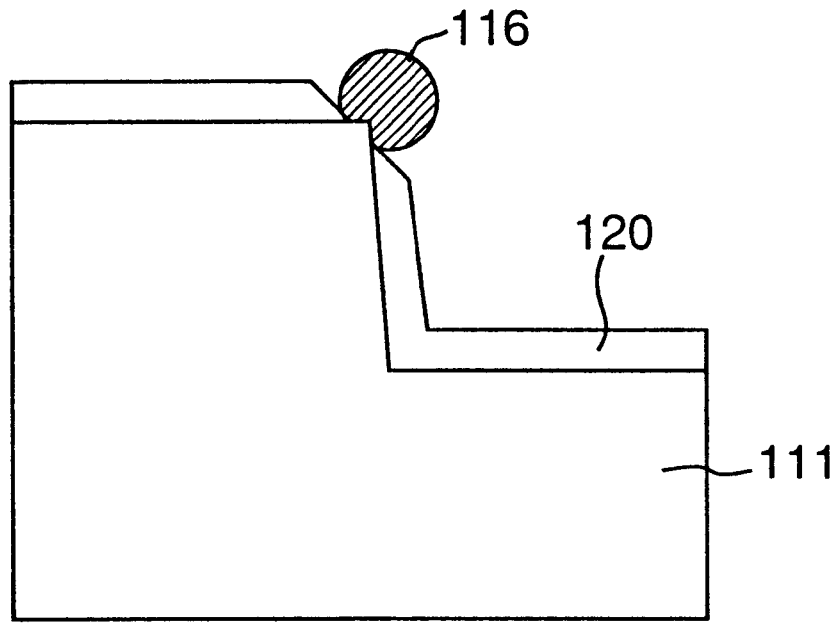
FIG. 14A is a sectional view of the above thin line after the formation of the thin line.
Figure 14B:
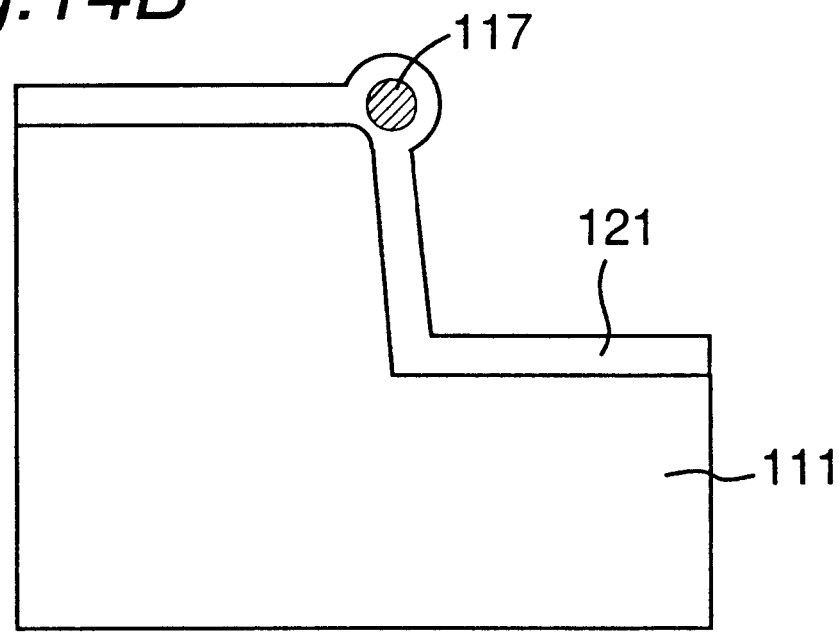
FIG. 14B is a sectional view showing a state in which the thin line and the semiconductor substrate are isolated from each other by oxidation.

Further, after the formation of the thin line 116, the connecting region of the thin line 116 and the silicon substrate 111 and the thermally oxidized film 120 are oxidized until the flat portion comes to have an oxide film thickness of 6.5 nm, and the oxidized thin line 117 and the silicon substrate 111 are isolated from each other by an oxide film 121 (see FIGS. 14A and 14B).

Figure 15A:
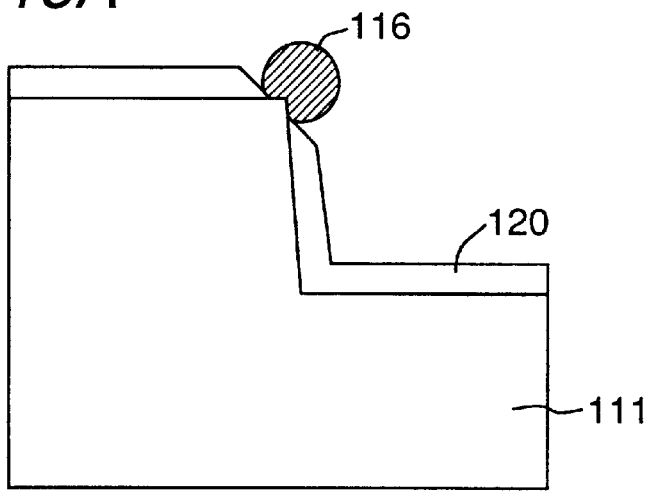
FIG. 15A is a sectional view of the above thin line after the formation of the thin line.
Figure 15B:
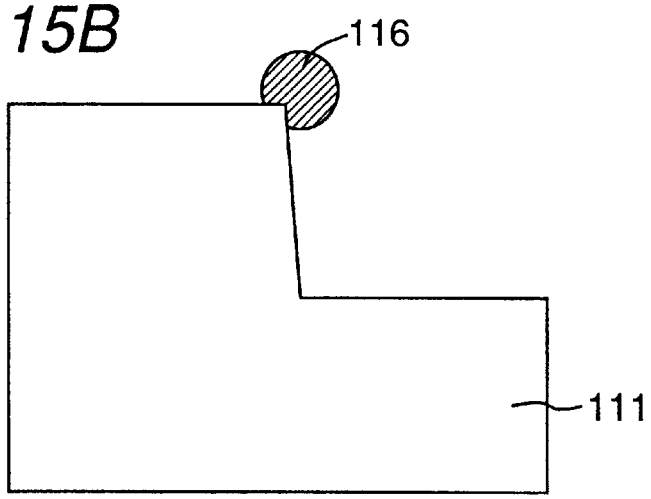
FIG. 15B is a sectional view showing a state in which oxide film is removed.
Figure 15C:
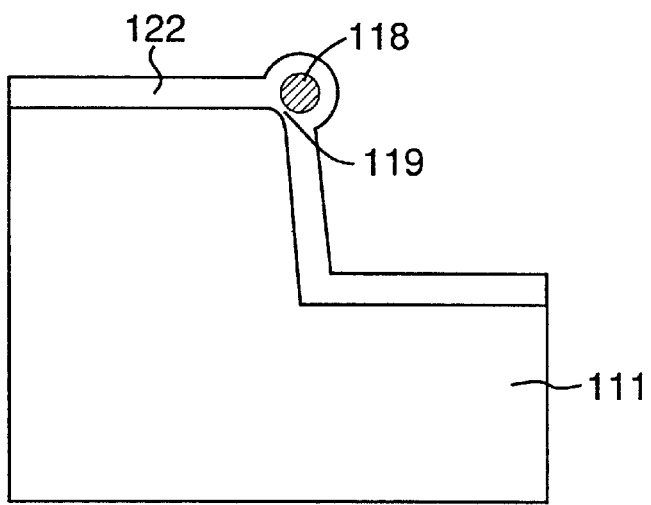
FIG. 15C is a sectional view showing a state in which the thin line and the semiconductor substrate are isolated again from each other by oxidation after the removal of the oxide film.

By removing the oxidized film 120 (whose flat portion has a thickness of 1.5 nm) remaining on the semiconductor surface from the state shown in FIG. 15A prior to the oxidation for the isolation so as to establish a state as shown in FIG. 15B and thereafter oxidizing the thin line 116 and silicon substrate 111, a thermally oxidized film 122 is formed as shown in FIG. 15C, a thin line 118 and the silicon substrate 111 are isolated from each other by an oxide film 119 having a film thickness of 5 nm formed at the same time (see FIGS. 15A through 15C).

Thus the thin line 117 (or the thin line 118) having a width of about 5 nm is formed.

As described above, the thin line 116 that serves as the microstructure made of silicon Si is selectively formed only on the surface of the edge portion 114 that serves as the base. Therefore, by controlling the position in which the edge portion that is not covered with the insulating thin film is formed by the generic film forming technique, lithography technique, etching technique and so on, the growth position of the thin line 116 can be controlled and the uniformity and reproducibility of the size of the thin line 116 become satisfactory. The microstructure producing method capable of materializing a microstructure that can be produced at low cost through simple processes without using any specific microfabrication technique and is appropriate for mass-production ensuring high yield and high productivity can be achieved.

By preliminarily forming the edge portion 114 on the surface of the silicon substrate 111 and oxidizing the surface of the silicon substrate 111, the thermally oxidized film 113 which has in the edge portion 114 the oxidized portion thinner than the other portion is formed as the insulating thin film. By etching the thermally oxidized film 113 and removing only the small-film-thickness region of the thermally oxidized film 113, only the semiconductor surface of the edge portion 114 can be easily exposed.

By oxidizing the connecting region of the thin line 116 and the silicon substrate 111 for the transubstantiation of the region into an oxide film 119 and isolating the thin line 116 and the silicon substrate 111 from each other by the oxide film 119, a quantum thin line that can be applied to a single-electron device can be obtained.

In the case where the thermally oxidized film 120 is once removed and thereafter the connecting region of the thin line 116 and the silicon substrate 111 is directly oxidized for the transubstantiation of the region into the oxide film 119 prior to oxidizing the connecting region of the thin line 116 and the silicon substrate 111 for the transubstantiation of the connecting region into the oxide film 119, the thin line 116 and the silicon substrate 111 can be reliably isolated from each other by the oxide film 119.

By introducing the silicon substrate 111 into the reaction chamber and thereafter evacuating the reaction chamber so as to produce a high vacuum of not greater than $10^{-6}$ Torr for the discharge of the atmospheric components and the impurities such as moisture, and thereafter making a material gas flow inside the reaction chamber for the production of a material gas partial pressure of not greater than $10^{-2}$ Torr, the thin line 116 can be stimulated to epitaxially grow only on the surface of the edge portion 114 that serves as the base. If the material gas partial pressure exceeds $10^{-2}$ Torr in the reaction stage, then film growth immediately starts throughout the entire surface of the insulating thin film, so that the selective growth cannot be achieved.

EIGHTH EMBODIMENT

Figure 16:
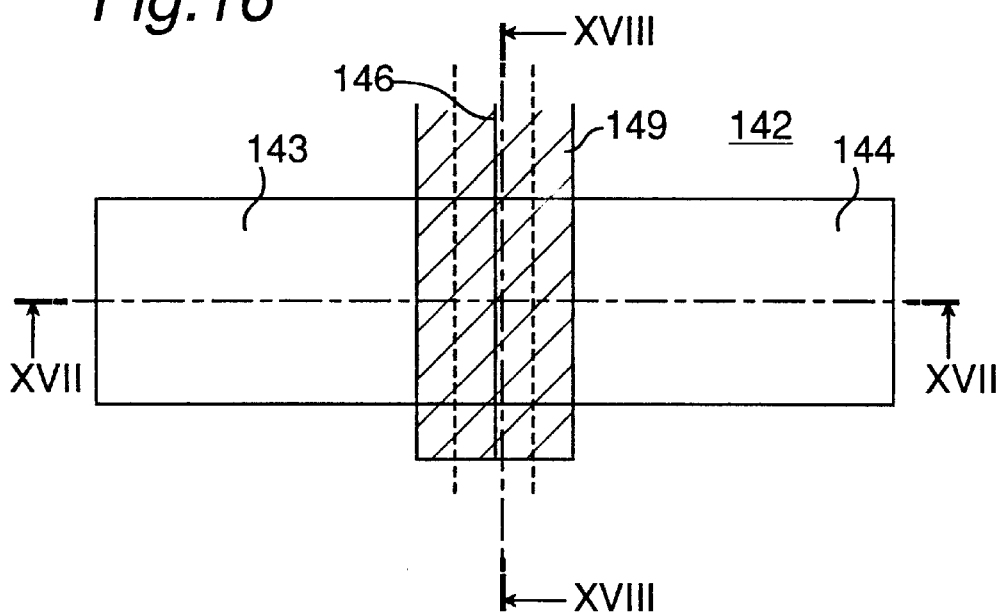
FIG. 16 is a plan view of a nonvolatile memory that serves as a semiconductor device employing a microstructure according to an eighth embodiment of the present invention.
Figure 17:
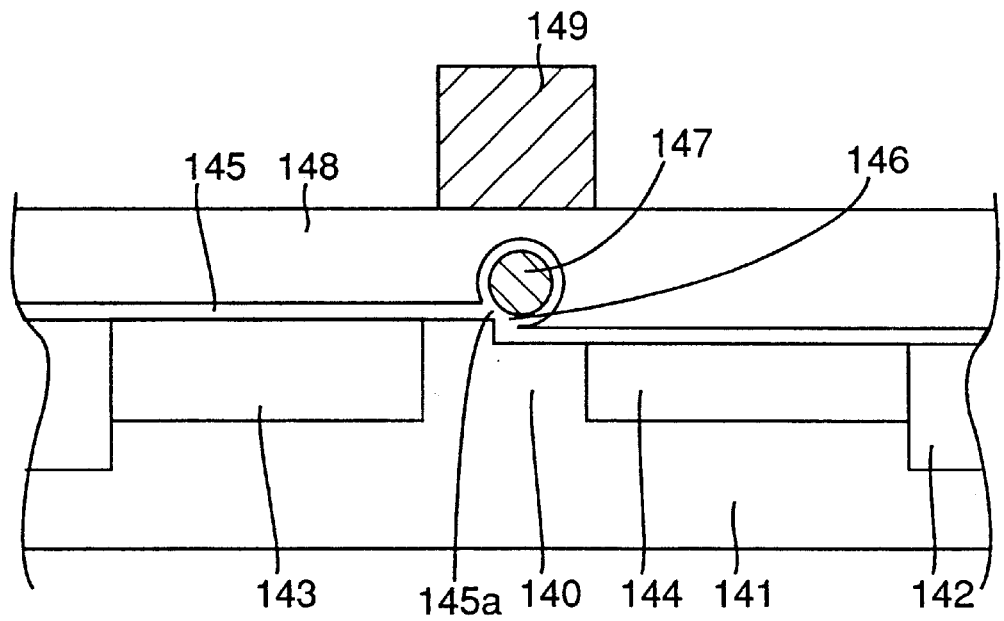
FIG. 17 is a sectional view taken along the line XVII—XVII in FIG. 16.
Figure 20:
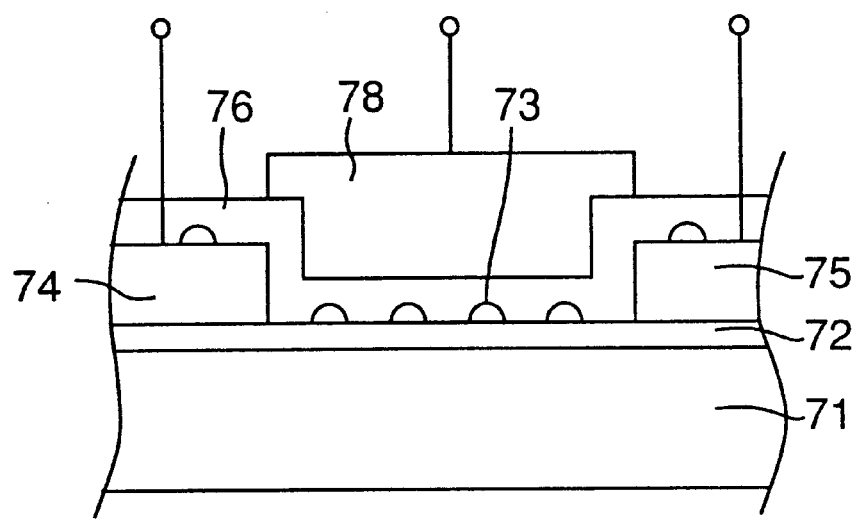
FIG. 20 is a sectional view of a single-electron transistor employing a quantum dot that serves as a semiconductor device employing a prior art microstructure.
Figure 21:
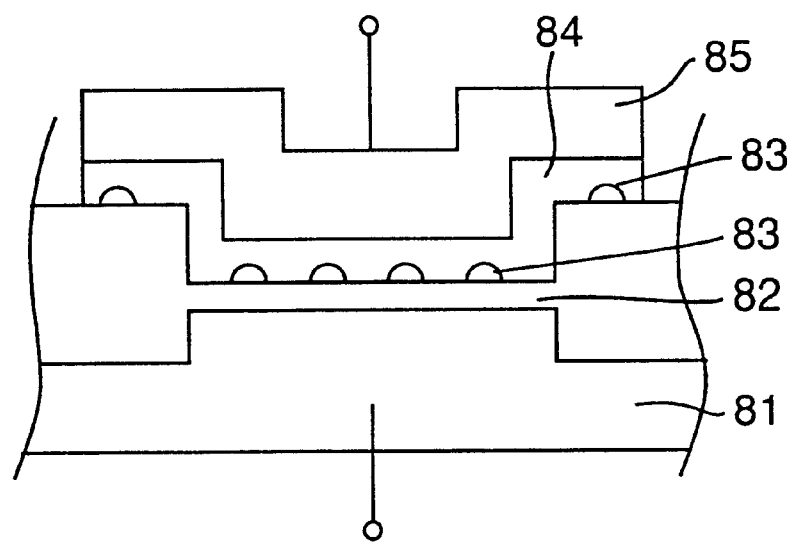
FIG. 21 is a sectional view of a light-emitting device employing a quantum dot that serves as a semiconductor device employing a prior art microstructure.
Figure 22A:
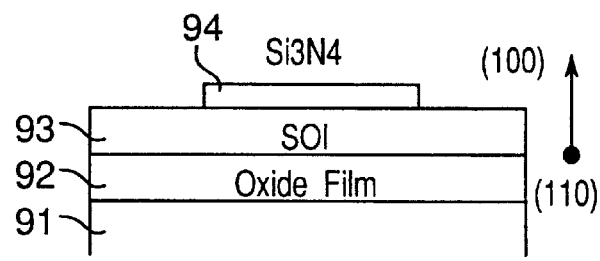
FIGS. 22A, 22B, 22C and 22D are process charts for explaining an Si quantum thin line producing method according to a prior art microstructure producing method.
Figure 22B:
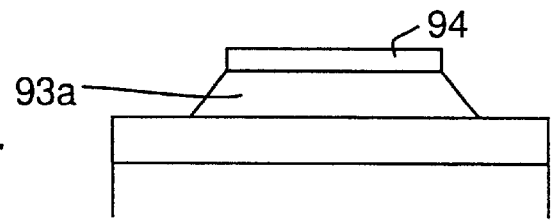
Figure 22C:
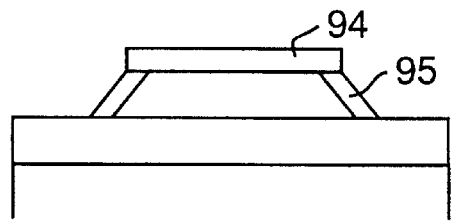
Figure 22D:
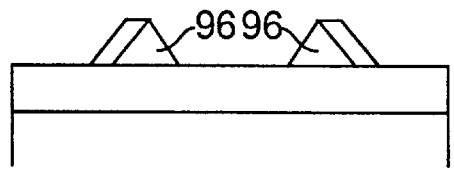
Figure 23:
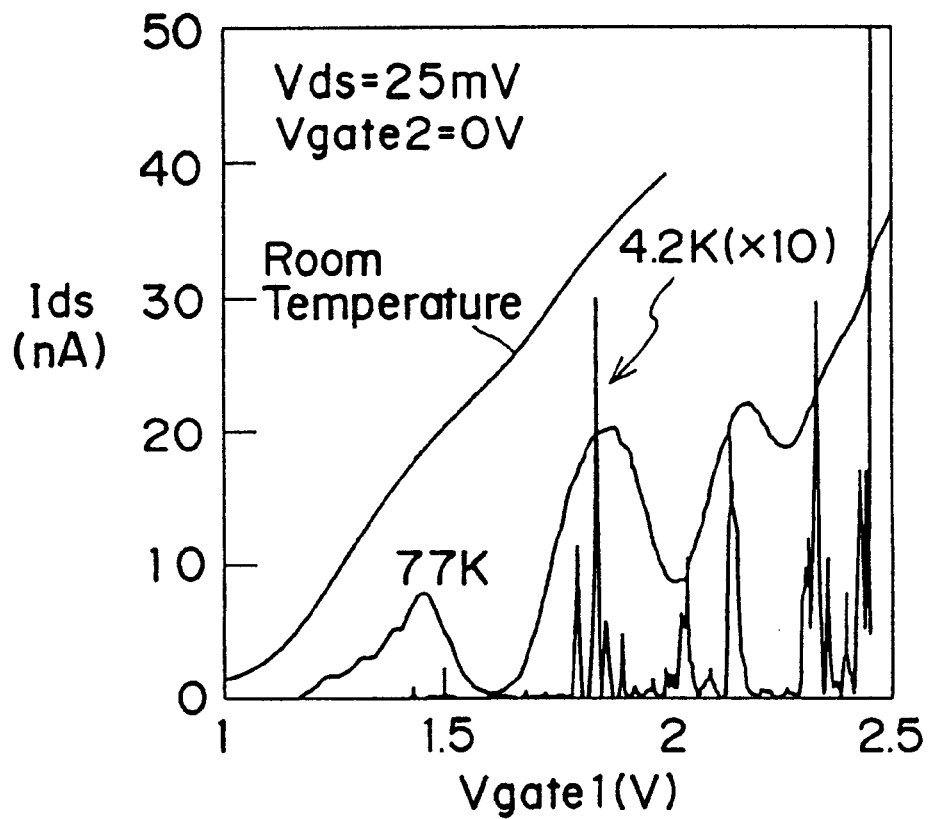
FIG. 23 is a graph showing the gate dependency of the drain current of the single-electron device employing the above Si quantum thin line.
Figure 24C:
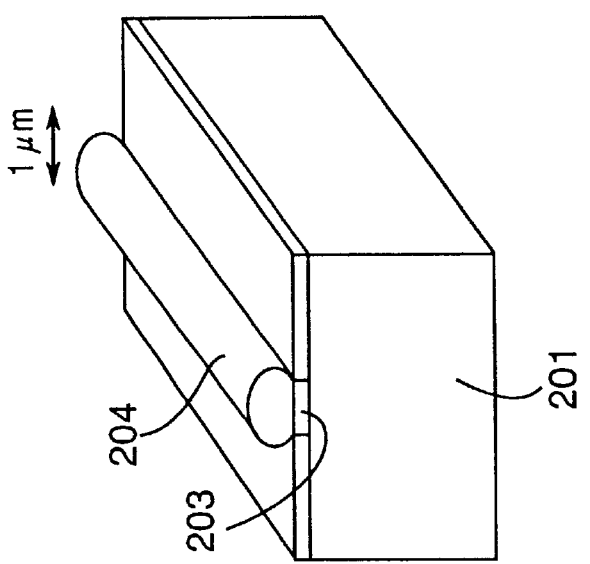
FIGS. 24A, 24B and 24C are views showing the growth process of an Si thin line utilizing the prior art selective growth.
Figure 24B:
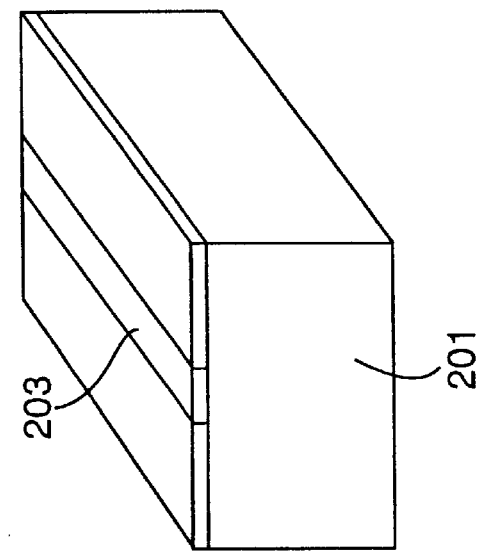
Figure 24A:
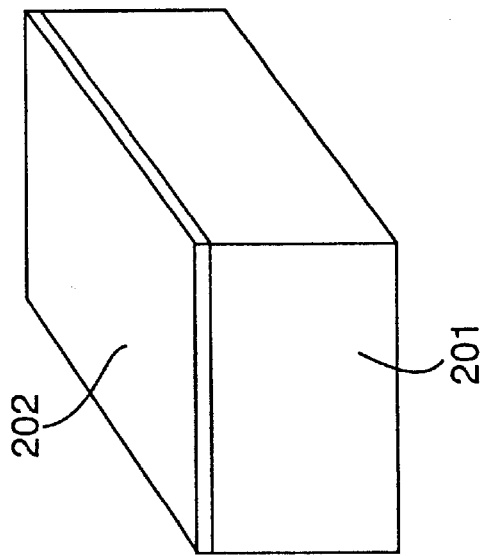

FIG. 16 is a plan view of a nonvolatile memory (flash EEPROM or the like) that serves as a semiconductor device employing the microstructure of the eighth embodiment of the present invention. FIG. 17 is a sectional view taken along the line XVII—XVII in FIG. 16.

As shown in FIG. 16 and FIG. 17, a rectangular region surrounded by an element isolation region 142 is formed on a silicon substrate 141, and a stepped portion 146 is formed in the direction approximately perpendicular to the lengthwise direction in the approximate center portion of the above region. Next, a tunnel insulating film 145 that has a film thickness of 2 nm and serves as a second insulating film and a thin line 147 that has a width of 5 nm and serves as a floating gate region isolated by the region 145 are formed by the thin line producing method of the seventh embodiment. Subsequently, a control gate insulating film 148 that has a film thickness of 10 nm and serves as a first insulating film is formed on the tunnel insulating film 145 and the thin line 147 by the CVD method. Then, a gate electrode 149 is formed on the control gate insulating film 148, and thereafter impurity ions are injected with the gate electrode 149 used as a mask, thereby forming source and drain regions 143 and 144 on the silicon substrate 141. A region corresponding to the gate electrode 149 between the source region 143 and the drain region 144 becomes an active region 140. As described above, the nonvolatile memory employing the thin line 147 in the floating gate region located between the active region 140 and the gate electrode 149 is constructed.

FIG. 18 is a sectional view taken along the line XVIII—XVIII in FIG. 16, where the thin line 147 is arranged so as to approximately perpendicularly intersect the direction in which the source region 143 and the drain region 144 shown in FIG. 16 are arranged.

Therefore, by employing the thin line 147 that serves as the microstructure in the floating gate region, the electric charges accumulated in the floating gate region can be reduced. Therefore, a nonvolatile memory having a very small power consumption, a super-high density and a large capacity can be materialized.

By employing the thin line 147 made of silicon Si formed by the above microstructure producing method in the floating gate region of the nonvolatile memory, the nonvolatile memory that ensures low cost, high yield and high productivity and is appropriate for mass-production can be materialized.

NINTH EMBODIMENT

FIG. 19A shows a plan view of a MOS (Metal Oxide Semiconductor) FET (Field-Effect Transistor) that serves as a semiconductor device employing the microstructure of the ninth embodiment of the present invention. FIG. 19B shows a sectional view taken along the line B—B in FIG. 19A. FIG. 19C shows a sectional view taken along the line C—C in FIG. 19A.

As shown in FIGS. 19A through 19C, a stepped portion 153 is formed on a silicon substrate 151, and thereafter an insulating film 152 and a thin line 154 (having a width of 5 nm) made of a nanometer-size semiconductor isolated by a region 152a are formed by the thin line producing method of the seventh embodiment. The thin line 154 is formed along the stepped portion 153 of the insulating film 152. Subsequently, a gate insulating film 155 having a film thickness of 30 nm is formed on the insulating film 152 and the thin line 154 by the CVD method. Then, a gate electrode 156 is formed on the gate insulating film 155, and thereafter impurity ions are injected with the gate electrode 156 used as a mask, thereby forming source and drain regions 157 and 158 on the thin line 154. A portion between the source region 157 and the drain region 158 of the thin line 154 becomes a channel region 159. Then, by making the thin line 154 have a width of not greater than 10 nm, the channel region 159 is quantized in the direction perpendicular to the direction in which the thin line 154 extends to exhibit linear conduction, so that a high-speed MOSFET can be obtained.

Therefore, by employing part of the thin line 154 that is the microstructure made of silicon Si in the channel region 159, a super-high-speed transistor or the like that ensures low cost, high yield and high productivity and is appropriate for mass-production can be materialized.

Although the silicon substrate is employed as the semiconductor substrate in the first through ninth embodiments, the semiconductor substrate is not limited to this, and a semiconductor substrate made of a material other than silicon may be employed.

Although disilane ($Si_2H_6$) is employed as the material gas in the case where the material of the minute particle and the thin line is the semiconductor of silicon Si in the first through ninth embodiments, any one of monosilane ($SiH_4$), trisilane ($Si_3H_8$), dichlorosilane ($SiH_2Cl_2$) and tetrachlorosilane ($SiCl_4$) may be used.

When the material of the minute particle and the thin line is made of germanium Ge, any one of monogermane ($GeH_4$), digermane ($Ge_2H_6$) and germanium tetrafluoride ($GeF_4$) may be used as the material gas.

When the material of the minute particle and the thin line is made of silicon germanium SiGe, a mixed gas of the gas of any one of monosilane ($SiH_4$), disilane ($Si_2H_6$), trisilane ($Si_3H_8$), dichlorosilane ($SiH_2Cl_2$) and tetrachlorosilane ($SiCl_4$) and the gas of any one of monogermane ($GeH_4$), digermane ($Ge_2H_6$) and germanium tetrafluoride ($GeF_4$) may be used as the material gas.

When the material of the minute particle and the thin line is made of metal aluminum Al, an organic aluminum such as dimethylaluminum hydride (DMAH: $(CH_3)_2AlH$) may be used.

It is to be noted that the material of the minute particle and the thin line is limited neither to the semiconductor of silicon Si, germanium Ge and silicon germanium SiGe nor to the metal of aluminum Al.

Although the first through third embodiments have been described on the basis of the microstructure producing method of either one of the minute particle and the thin line, it is a matter of course that both the minute particle and the thin line may be formed concurrently. The minute particle or the thin line, which is the microstructure, is made to selectively grow as a crystal in the small-film-thickness region of the insulating thin film in the first through third embodiments, it is also acceptable to selectively form an amorphous minute particle or thin line in the small-film-thickness region of the insulating thin film.

The microstructure producing method of the present invention is applied to the concrete devices in the fourth and fifth embodiments. However, the method can also be used for the wiring of a high-density LSI since the method can form a superfine thin line of a conductive material without using any specific microfabrication apparatus.

The semiconductor device having the quantum dot or quantum thin line that serves as the basis of the quantum-effect device and the single-electron device produced by the microstructure producing method of the present invention can be mounted on the substrate identical to that of an Si-based large-scale integrated circuit. By applying this semiconductor device to a light-emitting device or a photoelectric transducer, the integration of an electronic circuit with an optical communication circuit can be achieved.

As is apparent from the above description, the microstructure producing method of the present invention has the steps of forming the insulating thin film having the great-film-thickness region and the small-film-thickness region in at least part of the semiconductor substrate surface and thereafter selectively forming the microstructure of at least one of the minute particle and the thin line made of a metal or semiconductor.

Therefore, according to the microstructure producing method of the present invention, by controlling the position in which the small-film-thickness region of the insulating thin film is formed, by the generic film forming technique, lithography technique, etching technique and so on, the growth position of the minute particle or the thin line can be controlled, and the uniformity and reproducibility of the size and density of the minute particle or the thin line become satisfactory. There can be obtained a realistic microstructure mass-producing method capable of producing the microstructure at low cost through the simple processes without using any specific microfabrication technique while ensuring high yield and high productivity.

According to the microstructure producing method of an embodiment, when forming the insulating thin film on the semiconductor substrate surface, the insulating thin film is formed on the semiconductor substrate surface and thereafter only the partial region of the insulating thin film is reduced in thickness. Therefore, only the partial region of the insulating thin film can be reduced in thickness by the generic film forming technique, lithography technique, etching technique and so on, and the thin region can be easily formed through the simple processes.

According to the microstructure producing method of an embodiment, when forming the insulating thin film on the semiconductor substrate surface, the first portion that becomes the thick region is formed on the semiconductor substrate surface, and after the removal of only the partial region of the first portion, the second portion that becomes the thin region is formed on the semiconductor substrate surface from which the first portion has been removed. Therefore, by controlling the position in which the exposed region of the semiconductor substrate surface is formed, by the generic film forming technique, lithography technique, etching technique and so on, the position in which the microstructure is formed can be easily controlled.

According to the microstructure producing method of an embodiment, after the formation of the first portion on the semiconductor substrate surface, the part of the semiconductor substrate surface is exposed by patterning the first portion, and thereafter the second portion is formed by oxidizing the exposed region of the semiconductor substrate surface. Therefore, the small-film-thickness region can be obtained through the simple processes.

According to the microstructure producing method of an embodiment, after the formation of the first portion on the semiconductor substrate surface, the part of the semiconductor substrate surface is exposed by patterning the first portion, and thereafter the second portion is deposited on the exposed region of the semiconductor substrate surface. Therefore, the small-film-thickness region can be obtained through the simple processes.

According to the microstructure producing method of an embodiment, the edge portion is preliminarily formed on the semiconductor substrate surface prior to the step for forming the insulating thin film on the semiconductor substrate surface. If the semiconductor substrate surface on which the edge portion has preliminarily been formed is oxidized when forming the insulating thin film on the semiconductor substrate surface, then the release of stress does not progress in the edge portion during oxidation and the oxide film thickness becomes smaller than that of the other portion. Therefore, the small-film-thickness region (edge portion) can be easily formed on the oxide film that serves as the insulating thin film.

According to the microstructure producing method of an embodiment, the shape having the difference in level or the sharp edge is preliminarily formed on the semiconductor substrate surface prior to the step for forming the insulating thin film on the semiconductor substrate surface. If the semiconductor substrate surface on which the shape having the difference in level or the sharp edge has preliminarily been formed is oxidized when forming the insulating thin film on the semiconductor substrate surface, then the release of stress does not progress in the shape having the difference in level or the sharp edge during oxidation and the oxide film thickness becomes smaller than that of the other portion. Therefore, the small-film-thickness region (the shape having the difference in level or the sharp edge) can be easily formed on the oxide film that serves as the insulating thin film.

According to the microstructure producing method of an embodiment, by introducing the semiconductor substrate into the reaction chamber, discharging air so as to produce a high vacuum of not greater than $10^{-6}$ Torr in the reaction chamber, thereafter making a material gas flow inside the reaction chamber and subjecting the microstructure to vapor growth only in the small-film-thickness region of the insulating thin film under the material gas partial pressure of not greater than $10^{-2}$ Torr. Therefore, by controlling the degree of vacuum, the amount of introduction and the time of introduction of the material gas, the substrate temperature and so on inside the reaction chamber by means of the generic high-vacuum CVD reactor, the minute particle or the thin line of the desired size and density can be uniformity formed with high reproducibility.

According to the microstructure producing method of an embodiment, any one of monosilane ($SiH_4$), disilane ($Si_2H_6$), trisilane ($Si_3H_8$), dichlorosilane ($SiH_2Cl_2$) and tetrachlorosilane ($SiCl_4$) is used as the material gas when the microstructure is made of silicon. Therefore, by inducing a reaction by means of the generic CVD reactor for the formation of the minute particle or thin line made of silicon on the small-film-thickness region of the insulating thin film, the uniformity and reproducibility of the size and density of the minute particle or the thin line are further improved.

According to the microstructure producing method of an embodiment, any one of monogermane ($GeH_4$), digermane ($Ge_2H_6$) and germanium tetrafluoride ($GeF_4$) is used as the material gas when the microstructure is made of germanium. Therefore, by inducing a reaction by means of the generic CVD reactor for the formation of the minute particle or thin line made of germanium on the small-film-thickness region of the insulating thin film, the uniformity and reproducibility of the size and density of the minute particle or the thin line are further improved.

According to the microstructure producing method of an embodiment, the mixed gas of the gas of any one of monosilane ($SiH_4$), disilane ($Si_2H_6$), trisilane ($Si_3H_8$), dichlorosilane ($SiH_2Cl_2$) and tetrachlorosilane ($SiCl_4$) and the gas of any one of monogermane ($GeH_4$), digermane ($Ge_2H_6$) and germanium tetrafluoride ($GeF_4$) is used as the material gas when the microstructure is made of silicon germanium. Therefore, by inducing a reaction by means of the generic CVD reactor for the formation of the minute particle or thin line made of silicon germanium on the small-film-thickness region of the insulating thin film, the uniformity and reproducibility of the size and density of the minute particle or the thin line are further improved.

According to the microstructure producing method of an embodiment, the organic aluminum is used as the material when the microstructure is made of aluminum. Therefore, by inducing a reaction by means of, for example, the organic metal CVD reactor for the formation of the minute particle or thin line made of aluminum on the small-film-thickness region of the insulating thin film, the uniformity and reproducibility of the size and density of the minute particle or the thin line are further improved.

The present invention also provides a microstructure producing method including the processes for forming the edge portion on the semiconductor substrate surface, forming the insulating thin film in the region other than the edge portion of the semiconductor substrate surface and selectively forming the microstructure that is the thin line made of the semiconductor only on the surface of the edge portion.

Therefore, according to the microstructure producing method of the present invention, by controlling the position in which the edge portion that is not covered with the insulating thin film is formed by the generic film forming technique, lithography technique, etching technique and so on, the growth position of the thin line can be controlled and the uniformity and reproducibility of the size of the thin line become satisfactory, thereby allowing the microstructure to be produced through the simple processes without using any specific microfabrication technique. Therefore, the realistic microstructure producing method capable of reducing the manufacturing cost and ensuring high yield and high productivity can be obtained. By using the microstructure as a quantum thin line, a semiconductor device having superior characteristics can be materialized.

According to the microstructure producing method of an embodiment, the insulating thin film is formed by oxidizing the semiconductor substrate on which the edge portion is formed, and after the formation of the region having the film thickness smaller than that of the other region at the edge portion of the insulating thin film, only the surface of the edge portion is exposed by further etching the insulating thin film. Therefore, only the semiconductor surface of the edge portion can be easily exposed.

According to the microstructure producing method of an embodiment, the connecting region of the microstructure that is the thin line made of the semiconductor and the semiconductor substrate is transubstantiated into the oxide film through oxidation after the formation of the microstructure that is the thin line made of the semiconductor. Therefore, by isolating the thin line and the semiconductor substrate from each other by the oxide film, a quantum thin line applicable to the single-electron device can be obtained.

According to the microstructure producing method of an embodiment, the connecting region of the microstructure that is the thin line made of the semiconductor and the semiconductor substrate is transubstantiated into the oxide film through oxidation after once removing the insulating thin film. Therefore, the oxide film that reliably isolates the thin line and the semiconductor substrate from each other can be formed.

According to the microstructure producing method of an embodiment, by introducing the semiconductor substrate into the reaction chamber, discharging air so as to produce a high vacuum of not greater than $10^{-6}$ Torr in the reaction chamber, thereafter making a material gas flow inside the reaction chamber and subjecting the microstructure to vapor growth only on the surface of the edge portion under the material gas partial pressure of not greater than $10^{-2}$ Torr. Therefore, by controlling the degree of vacuum, the amount of introduction and the time of introduction of the material gas, the substrate temperature and so on inside the reaction chamber by means of the generic high-vacuum CVD reactor, the microstructure of the desired size and density can be uniformity formed with high reproducibility.

According to the microstructure producing method of an embodiment, any one of monosilane ($SiH_4$), disilane ($Si_2H_6$), trisilane ($Si_3H_8$), dichlorosilane ($SiH_2Cl_2$) and tetrachlorosilane ($SiCl_4$) is used as the material gas when the microstructure is made of silicon. Therefore, by inducing a reaction by means of the generic CVD reactor for the formation of the microstructure made of silicon on the small-film-thickness region of the insulating thin film, the uniformity and reproducibility of the size and density of the microstructure are further improved.

According to the microstructure producing method of an embodiment, any one of monogermane ($GeH_4$), digermane ($Ge_2H_6$) and germanium tetrafluoride ($GeF_4$) is used as the material gas when the microstructure is made of germanium. Therefore, by inducing a reaction by means of the generic CVD reactor for the formation of the microstructure made of germanium on the small-film-thickness region of the insulating thin film, the uniformity and reproducibility of the size and density of the microstructure are further improved.

According to the microstructure producing method of an embodiment, the mixed gas of the gas of any one of monosilane ($SiH_4$), disilane ($Si_2H_6$), trisilane ($Si_3H_8$) dichlorosilane ($SiH_2Cl_2$) and tetrachlorosilane ($SiCl_4$) and the gas of any one of monogermane ($GeH_4$), digermane ($Ge_2H_6$) and germanium tetrafluoride ($GeF_4$) is used as the material gas when the microstructure is made of silicon germanium. Therefore, by inducing a reaction by means of the generic CVD reactor for the formation of the microstructure made of silicon germanium on the small-film-thickness region of the insulating thin film, the uniformity and reproducibility of the size and density of the microstructure are further improved.

A semiconductor device employing the microstructure of an embodiment includes the source region, the drain region, the channel region located between the source region and the drain region, the gate region for controlling the channel current flowing through the channel region, the floating gate region located between the channel region and the gate region, the first insulating film located between the floating gate region and the gate region, and the second insulating film located between the channel region and the floating gate region. The floating gate region is the microstructure formed by any one of the aforementioned microstructure producing methods.

Therefore, according to the semiconductor device employing the above microstructure, by using at least one of the minute particle and the thin line as the floating gate region, a non-volatile memory whose capabilities of low power consumption, high density and large capacity are remarkably improved can be materialized. Furthermore, a nonvolatile memory appropriate for mass-production ensuring low cost, high yield and high productivity can be materialized. The semiconductor device employing the microstructure of the present invention can also be mounted on the substrate identical to that of the Si-based large-scale integrated circuit that serves as the semiconductor device having the quantum dot or the quantum thin line, which is the basis of the single-electron device.

A semiconductor device employing the microstructure of an embodiment includes the source region, the drain region, the channel region located between the source region and the drain region, the gate region for controlling the channel current flowing through the channel region, and the gate insulating film located between the channel region and the gate region. The channel region is the thin line made of the semiconductor formed by any one of the aforementioned microstructure producing methods.

Therefore, according to the semiconductor device employing the above microstructure, by using the thin line as the channel region, the channel region is quantized in the direction perpendicular to the direction in which the thin line extends to exhibit linear conduction. Therefore, a transistor capable of operating at super-high speed can be obtained, so that a super-high-speed transistor appropriate for mass-production ensuring low cost, high yield and high reproducibility can be materialized. The semiconductor device employing the microstructure of the present invention can be mounted on the substrate identical to that of the Si-based large-scale integrated circuit that serves as the semiconductor device having the quantum thin line, which is the basis of the quantum-effect device.

A semiconductor device employing the microstructure of an embodiment is provided with a minute particle made of the semiconductor formed by any one of the aforementioned microstructure producing methods, the insulating films that are formed so as to put the minute particle between the insulating films and the electrodes that are formed so as to further put the insulating films between the electrodes. The minute particle emits light by applying a voltage across the electrodes.

Therefore, according to the semiconductor device employing the microstructure of the above embodiment, by putting the minute particle made of the semiconductor between the insulating films and further putting the insulating films between the electrodes for the formation of the direct transition type band structure of the minute particle, a light-emitting device that emits light from the minute particle upon the application of the voltage across the electrodes and is appropriate for mass-production ensuring low cost, high yield and high reproducibility can be materialized. The semiconductor device employing the microstructure of the present invention can be mounted on the substrate identical to that of the Si-based large-scale integrated circuit as the semiconductor device having the quantum dot, which is the basis of the quantum-effect device. By applying this semiconductor device to a light-emitting device or a photoelectric transducer, the integration of an electronic circuit with an optical communication circuit can be achieved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A microstructure producing method comprising:
    forming an insulating thin film having a region of a great or greater film thickness and a region of a small film thickness on at least one portion of a semiconductor substrate, so that in said region of small film thickness the insulating film has a smaller thickness than in said region of great or greater film thickness; and
    selectively forming a crystal inclusive microstructure of at least one of a minute particle and a thin line comprised of a metal or semiconductor, wherein the minute particle or thin line has a diameter or thickness of no greater than several tens of nanometers, and wherein said forming takes place only in the region of the small film thickness of the insulating thin film and not in the region of greater film thickness.

2. A microstructure producing method as claimed in claim 1, wherein
    the step of forming the insulating thin film on the semiconductor substrate surface includes forming an insulating thin film on the semiconductor substrate surface and thereafter reducing in thickness only a partial region of the insulating thin film.

3. A microstructure producing method as claimed in claim 1, wherein
    the step of forming the insulating thin film on the semiconductor substrate surface includes forming a first portion that becomes the thick region on the semiconductor substrate surface, removing only a partial region of the first portion and thereafter forming the second portion that becomes the thin region on the semiconductor substrate surface from which the first portion is removed.

4. A microstructure producing method as claimed in claim 3, wherein
    the semiconductor substrate surface is partially exposed by patterning the first portion after the formation of the first portion on the semiconductor substrate surface, and thereafter the second portion is formed by oxidizing the exposed region of the semiconductor substrate surface.

5. A microstructure producing method as claimed in claim 3, wherein
    the semiconductor substrate surface is partially exposed by patterning the first portion after the formation of the first portion on the semiconductor substrate surface, and thereafter the second portion is deposited on the exposed region of the semiconductor substrate surface.

6. A microstructure producing method as claimed in claim 1, further comprising the step of:
    forming an edge portion on the semiconductor substrate surface prior to the step of forming the insulating thin film on the semiconductor substrate surface, and wherein
        the step of forming the insulating thin film on the semiconductor substrate surface includes forming the insulating thin film by oxidizing the semiconductor substrate surface on which the edge portion is formed so as to form the region of the small film thickness smaller than that of the other region in the edge portion of the insulating thin film.

7. A microstructure producing method as claimed in claim 1, further comprising the step of:
    forming a shape having a difference in level or a sharp edge on the semiconductor substrate surface prior to the step of forming the insulating thin film on the semiconductor substrate surface, and wherein
        the step of forming the insulating thin film on the semiconductor substrate surface includes forming the insulating thin film by oxidizing the semiconductor substrate surface on which the shape having the difference in level or the sharp edge is formed, so as to form the region of the small film thickness smaller than that of the other region in the shape having the difference in level or the sharp edge of the insulating thin film.

8. A microstructure producing method as claimed in claim 1, wherein
    the step of forming the microstructure only on the surface of the region having the small film thickness of the insulating thin film includes introducing the semiconductor substrate into a reaction chamber, evacuating the reaction chamber so as to produce a high vacuum of not greater than $10^{-6}$ Torr inside the reaction chamber, thereafter making a material gas flow inside the reaction chamber and subjecting the microstructure to vapor growth only in the region having the small film thickness of the insulating thin film under a material gas partial pressure of not greater than $10^{-2}$ Torr.

9. A microstructure producing method as claimed in claim 8, wherein
    the microstructure is made of silicon; and
    any one of monosilane ($SiH_4$), disilane ($Si_2H_6$), trisilane ($Si_3H_8$), dichlorosilane ($SiH_2Cl_2$) and tetrachlorosilane ($SiCl_4$) is used as the material gas.

10. A microstructure producing method as claimed in claim 8, wherein
    the microstructure is made of germanium; and
    any one of monogermane ($GeH_4$), digermane ($Ge_2H_6$) and germanium tetrafluoride ($GeF_4$) is used as the material gas.

11. A microstructure producing method as claimed in claim 8, wherein
    the microstructure is made of silicon germanium; and
    a mixed gas of a gas of any one of monosilane ($SiH_4$), disilane ($Si_2H_6$), trisilane ($Si_3H_8$), dichlorosilane ($SiH_2Cl_2$) and tetrachlorosilane ($SiCl_4$) and a gas of any one of monogermane ($GeH_4$), digermane ($Ge_2H_6$) and germanium tetrafluoride ($GeF_4$) is used as the material gas.

12. A microstructure producing method as claimed in claim 8, wherein
    the microstructure is made of aluminum; and
    an organic aluminum is used as a material.

13. A microstructure producing method comprising:
    forming an edge portion of a stepped portion on a semiconductor substrate surface;
    forming an insulating thin film in a region other than the edge portion of the semiconductor substrate surface so that the edge portion of the semiconductor substrate is exposed; and
    selectively forming a microstructure comprising a thin line made of a semiconductor, the thin line being formed only on a surface of the exposed edge portion, said thin line having a size capable of producing a quantum effect.

14. A microstructure producing method as claimed in claim 13, wherein the step of forming the insulating thin film in the region other than the edge portion includes forming the insulating thin film by oxidizing the semiconductor substrate on which the edge portion is formed, forming a region of a film thickness smaller than that of the other region in the edge portion of the insulating thin film and thereafter exposing only the semiconductor surface of the edge portion by further etching the insulating thin film.

15. A microstructure producing method as claimed in claim 13, further comprising the step of:

transubstantiating a connecting region of the microstructure that is the thin line made of the semiconductor and the semiconductor substrate into an oxide film through oxidation after forming the microstructure that is the thin line made of the semiconductor.

16. A microstructure producing method as claimed in claim 15, wherein the step of transubstantiating the connecting region of the microstructure that is the thin line made of the semiconductor and the semiconductor substrate into the oxide film through oxidation includes once removing the insulating thin film and thereafter transubstantiating the connecting region of the microstructure that is the thin line made of the semiconductor and the semiconductor substrate into the oxide film through oxidation.

17. A microstructure producing method as claimed in claim 13, wherein the step of selectively forming the microstructure that is the thin line made of the semiconductor only on the surface of the edge portion includes introducing the semiconductor substrate into a reaction chamber, evacuating the reaction chamber so as to produce a high vacuum of not greater than $10^{-6}$ Torr inside the reaction chamber, thereafter making a material gas flow inside the reaction chamber and subjecting the microstructure of the thin line made of the semiconductor to vapor growth only on the surface of the edge portion under a material gas partial pressure of not greater than $10^{-2}$ Torr.

18. A microstructure producing method as claimed in claim 17, wherein the microstructure is made of silicon; and any one of monosilane ($SiH_4$), disilane ($Si_2H_6$), trisilane ($Si_3H_8$), dichlorosilane ($SiH_2Cl_2$) and tetrachlorosilane ($SiCl_4$) is used as the material gas.

19. A microstructure producing method as claimed in claim 17, wherein the microstructure is made of germanium; and any one of monogermane ($GeH_4$), digermane ($Ge_2H_6$) and germanium tetrafluoride ($GeF_4$) is used as the material gas.

20. A microstructure producing method as claimed in claim 17, wherein the microstructure is made of silicon germanium; and a mixed gas of a gas of any one of monosilane ($SiH_4$), disilane ($Si_2H_6$), trisilane ($Si_3H_8$), dichlorosilane ($SiH_2Cl_2$) and tetrachlorosilane ($SiCl_4$) and a gas of any one of monogermane ($GeH_4$), digermane ($Ge_2H_6$) and germanium tetrafluoride ($GeF_4$) is used as the material gas.

21. A semiconductor device provided with a source region, a drain region, a channel region located between the source region and the drain region, a gate region for controlling a channel current flowing through the channel region, a floating gate region located between the channel region and the gate region, a first insulating film located between the floating gate region and the gate region, and a second insulating film located between the channel region and the floating gate region, the floating gate region being a microstructure formed by the microstructure producing method of claim 1.

22. A semiconductor device provided with a source region, a drain region, a channel region located between the source region and the drain region, a gate region for controlling a channel current flowing through the channel region, a floating gate region located between the channel region and the gate region, a first insulating film located between the floating gate region and the gate region, and a second insulating film located between the channel region and the floating gate region, the floating gate region being a microstructure formed by the microstructure producing method of claim 13.

23. A semiconductor device provided with a source region, a drain region, a channel region located between the source region and the drain region, a gate region for controlling a channel current flowing through the channel region, and a gate insulating film located between the channel region and the gate region, the channel region being a thin line made of a semiconductor formed by the microstructure producing method of claim 1.

24. A semiconductor device provided with a source region, a drain region, a channel region located between the source region and the drain region, a gate region for controlling a channel current flowing through the channel region, and a gate insulating film located between the channel region and the gate region, the channel region being a thin line made of a semiconductor formed by the microstructure producing method of claim 13.

25. A semiconductor device provided with a minute particle made of a semiconductor formed by the microstructure producing method of claim 1, insulating films that are formed so as to put the minute particle between the insulating films and electrodes that are formed so as to further put the insulating films between the electrodes, the minute particle emitting light by applying a voltage across the electrodes.

26. The method of claim 1, wherein said region of small thickness comprises a channel formed in said region of great thickness.

27. The method of claim 13, wherein said edge portion is located at an upper corner of the stepped portion.

28. A method of forming a crystalline inclusive thin line on a semiconductor substrate, the method comprising:

providing a semiconductor substrate including a stepped portion, said stepped portion of the semiconductor substrate including a corner;

forming an insulating film on a portion of the semiconductor substrate in a manner such that said corner of the stepped portion is exposed and is not covered by the insulating film; and forming an elongated thin line of semiconductor material on the exposed corner of the stepped portion utilizing vapor growth under a material gas partial pressure of no greater than $10^{-2}$ Torr.

29. The method of claim 28, wherein said forming step includes forming the thin line only on the exposed corner of the stepped portion and not on the insulating film.

30. The method of claim 1, wherein the microstructure entirely fills up the region of the small film thickness.

31. The method of claim 1, wherein the microstructure is one of a quantum dot or quantum line microstructure having a size capable of producing a quantum effect.

32. The method of claim 13, wherein the microstructure is a quantum thin line.

33. The method of claim 28, wherein the line is a quantum thin line having a size capable of producing a quantum effect.

* * * * *

UNITED STATES PATENT AND TRADEMARK OFFICE
CERTIFICATE OF CORRECTION

PATENT NO.   : 6,326,311 B1
DATED        : December 4, 2001
INVENTOR(S)  : Ueda et al.

It is certified that error appears in the above-identified patent and that said Letters Patent is hereby corrected as shown below:

<u>Title page,</u>
Item [54], in the Title, after "THIN", insert -- LINE --.

MICROSTRUCTURE PRODUCING METHOD CAPABLE OF CONTROLLING GROWTH POSITION OF MINUTE PARTICLE OR THIN <u>LINE</u> AND SEMICONDUCTOR DEVICE EMPLOYING THE MICROSTRUCTURE.

Signed and Sealed this

Ninth Day of April, 2002

*Attest:*

JAMES E. ROGAN
*Director of the United States Patent and Trademark Office*

*Attesting Officer*